(12) United States Patent
Chida et al.

(10) Patent No.: US 8,340,803 B2
(45) Date of Patent: Dec. 25, 2012

(54) COMPONENT PLACEMENT APPARATUS, COMPONENT PLACEMENT SETTING CALCULATION APPARATUS, PROGRAM, AND COMPONENT PLACEMENT SETTING CALCULATION METHOD

(75) Inventors: Takafumi Chida, Yokohama (JP); Takahiro Nakano, Fujisawa (JP); Koichi Izuhara, Ooizumi (JP); Yoshiyuki Tsujimoto, Ooizumi (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 649 days.

(21) Appl. No.: 12/486,070

(22) Filed: Jun. 17, 2009

(65) Prior Publication Data
US 2010/0071201 A1 Mar. 25, 2010

(30) Foreign Application Priority Data
Sep. 22, 2008 (JP) ................................. 2008-242654

(51) Int. Cl.
*G06F 15/18* (2006.01)
(52) U.S. Cl. .............................. 700/121; 700/28; 716/54
(58) Field of Classification Search .................. 700/110, 700/120, 121; 716/54, 55, 132
See application file for complete search history.

(56) References Cited

U.S. PATENT DOCUMENTS

| | | | | |
|---|---|---|---|---|
| 6,538,244 B1 * | 3/2003 | Skunes | ...................... | 250/208.1 |
| 6,826,738 B2 * | 11/2004 | Cadouri | .......................... | 716/54 |
| 7,076,313 B2 * | 7/2006 | Welch | ............................. | 700/28 |
| 7,188,409 B2 * | 3/2007 | Gieskes | ......................... | 29/833 |
| 2005/0091845 A1 * | 5/2005 | Gieskes | ......................... | 29/833 |

OTHER PUBLICATIONS

Yamada et al., "An algorithm of feeder arrangements and pickup sequencing of component placement machine of printed circuit board", IPSJ (Information Processing Society of Japan) SIG Technical Report, 2005-MPS-55(3), pp. 9-12, Jun. 28, 2005.

* cited by examiner

*Primary Examiner* — John R. Cottingham
*Assistant Examiner* — Douglas Lee
(74) *Attorney, Agent, or Firm* — Antonelli, Terry, Stout & Kraus, LLP.

(57) ABSTRACT

The present invention is directed to a technique that avoids occurrence of interference among multiple placement heads, when multiple placement heads simultaneously access a circuit board, and a pallet which is arranged in one direction with respect to the circuit board. When the component placement part 150 having the multiple placement heads simultaneously pick up the components from the pallet 160 and simultaneously place the components on the circuit board, the controller 140 specifies a pair of component groups to be picked up simultaneously from the pallet 160 by the multiple placement heads and places the components on the circuit board, so that an area where the multiple placement heads move in overlapping manner is minimized, and the placement heads respectively pick up the components included in the pair of component groups being specified and place the components on the circuit board.

17 Claims, 18 Drawing Sheets

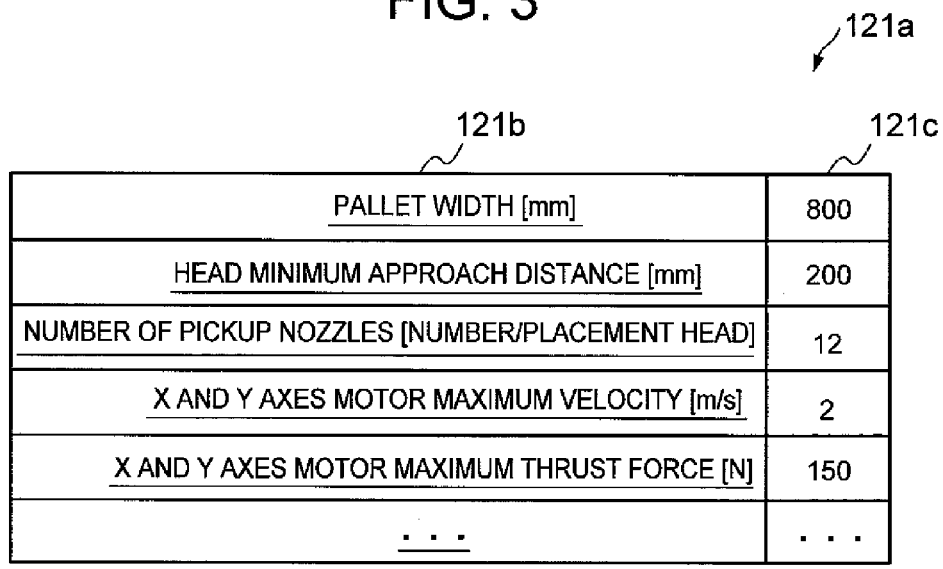
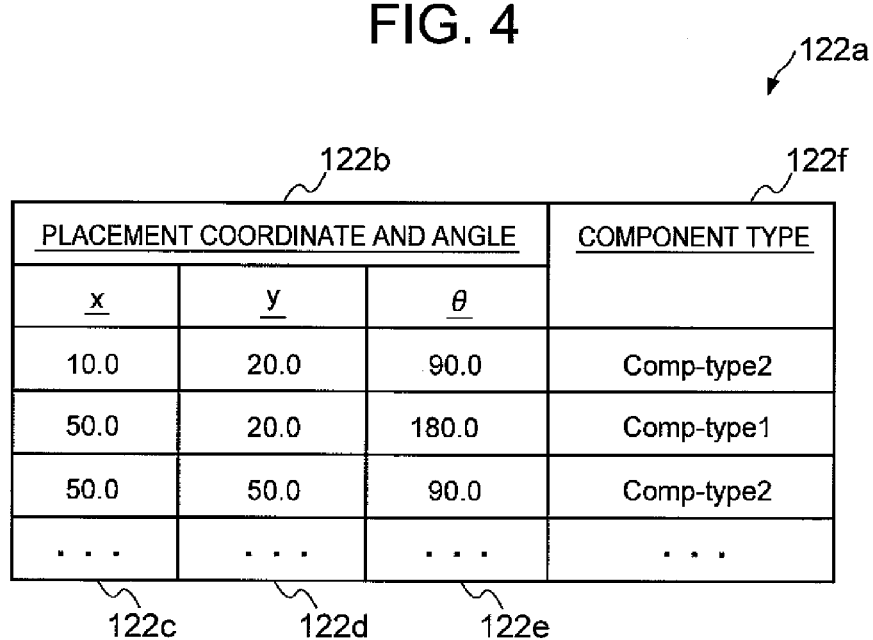

FIG. 5

| COMPONENT TYPE NAME | COMPONENT SIZE | | | WEIGHT | COMPONENT SUPPLY UNIT WIDTH | ... |
|---|---|---|---|---|---|---|
| | x | y | h | | | |
| Comp-type1 | 1.0 | 1.0 | 0.5 | 12 | 10 | ... |
| Comp-type2 | 1.0 | 4.0 | 1.0 | 4 | 10 | ... |
| ... | ... | ... | ... | ... | ... | ... |

COMPONENT PLACEMENT APPARATUS, COMPONENT PLACEMENT SETTING CALCULATION APPARATUS, PROGRAM, AND COMPONENT PLACEMENT SETTING CALCULATION METHOD

BACKGROUND OF THE INVENTION

1. Field of the Invention

The present invention relates to a technique in which multiple placement heads pick up components from a pallet, and place the components on a circuit board located in one direction with respect to the pallet.

2. Description of the Related Art

In a component placement apparatus, in which a placement head, which moves between a component pickup position and a component placement position, picks up a component located at a component supply position (component pickup position), transports and places the component on a circuit board at the component placement position, it is necessary to generate in advance a component placement setting, such as a mounting position on a component supply tray (hereinafter, referred to as a "pallet") of a component supply unit storing component to be placed on the circuit board, components pickup sequencing by the placement head, and placement sequencing.

By way of example, "An algorithm of feeder arrangements and pickup sequencing of component placement machine of printed circuit board, Tsuyoshi Yamada, Ryuhei Miyashiro, and Mario Nakamori, IPSJ (Information Processing Society of Japan) SIG Technical Report, 2005-MPS-55(3), pp. 9-12, Jun. 28, 2005, hereinafter referred to as "non-patent document 1", discloses a technique to calculate a component placement setting in a component placement machine under the condition that the component placement machine is provided with only one placement head and there is no possibility that multiple placement heads access simultaneously the circuit board and the pallet that is arranged in one direction with respect to the circuit board.

SUMMARY OF THE INVENTION

The technique described in the non-patent document 1 above calculates the component placement setting in the component placement machine having only one placement head, without any possibility that multiple placement heads access simultaneously the circuit board and the pallet arranged in one direction with respect to the circuit board. If the technique described in the above document is employed for calculating the component placement setting in a component placement machine in which multiple placement heads access simultaneously the circuit board and the pallet arranged in one direction with respect to the circuit board, collision may occur among the placement heads, disabling an appropriate component placement.

In view of the problem above, an object of the present invention is to provide a technique that avoids occurrence of interference among multiple placement heads, when multiple placement heads simultaneously access the circuit board and the pallet which is arranged in one direction with respect to the circuit board.

In order to solve the problem above, the present invention is directed to a configuration which avoids interference among the placement heads, when multiple placement heads pick up components from the pallet and place the components on the circuit board.

By way of example, the present invention is directed to a component placement apparatus in which multiple placement heads are allowed to operate simultaneously to pick up components from a pallet, and to place the components on the circuit board arranged in one direction with respect to the pallet, the component placement apparatus being provided with a controller to perform a processing, during one operation that the multiple placement heads pick up the components from the pallet and place the components on the circuit board, for specifying a pair of component groups to be simultaneously picked up from the pallet by the multiple placement heads so that an area where the multiple placement heads move in an overlapping manner is minimized, and a processing for allowing the placement heads to simultaneously provide operations to pick up the components included respectively in the component groups forming the pair, and to place the components being picked up on the circuit board.

As described above, according to the current invention, it is possible to prevent multiple placement heads from interfering with one another, when the multiple placement heads simultaneously access the circuit board and the pallet that is arranged in one direction with respect to the circuit board.

BRIEF DESCRIPTION OF DRAWINGS

FIG. 3 schematically illustrates the component placement apparatus information table 121a;

FIG. 4 schematically illustrates the mount circuit board information table 122a;

FIG. 5 schematically illustrates the mount component information table 123a;

FIG. 6 schematically illustrates the component placement setting information table 124a;

DESCRIPTION OF THE PREFERRED EMBODIMENTS

Figure 1:
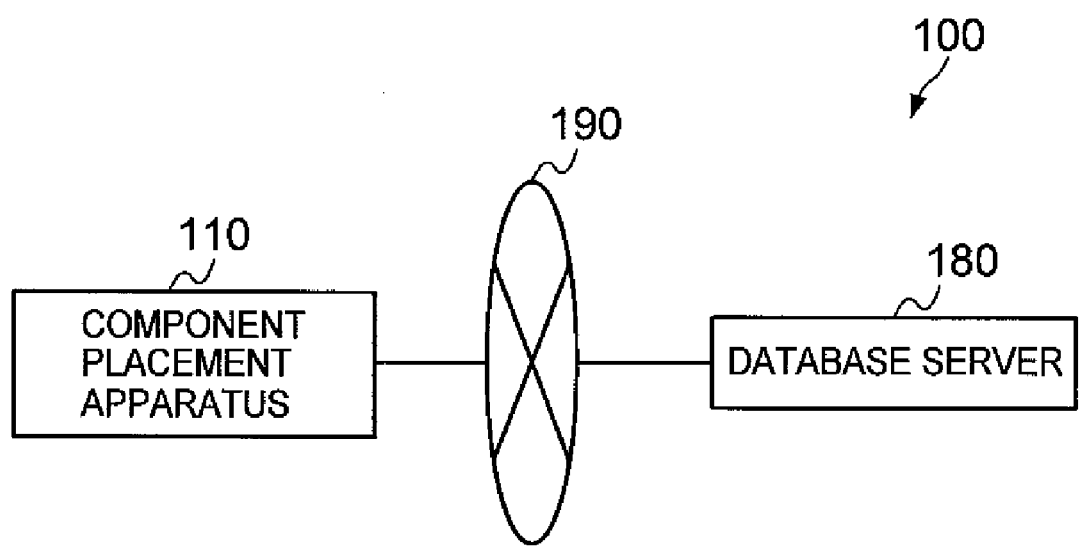
FIG. 1 schematically illustrates the component placement system 100.

FIG. 1 schematically illustrates the component placement system 100 according to one embodiment of the present invention. As illustrated, the component placement system 100 is provided with a component placement apparatus 110 and a database server 180, and the component placement apparatus 110 and the database server 180 are allowed to mutually exchange information via a network.

Figure 2:
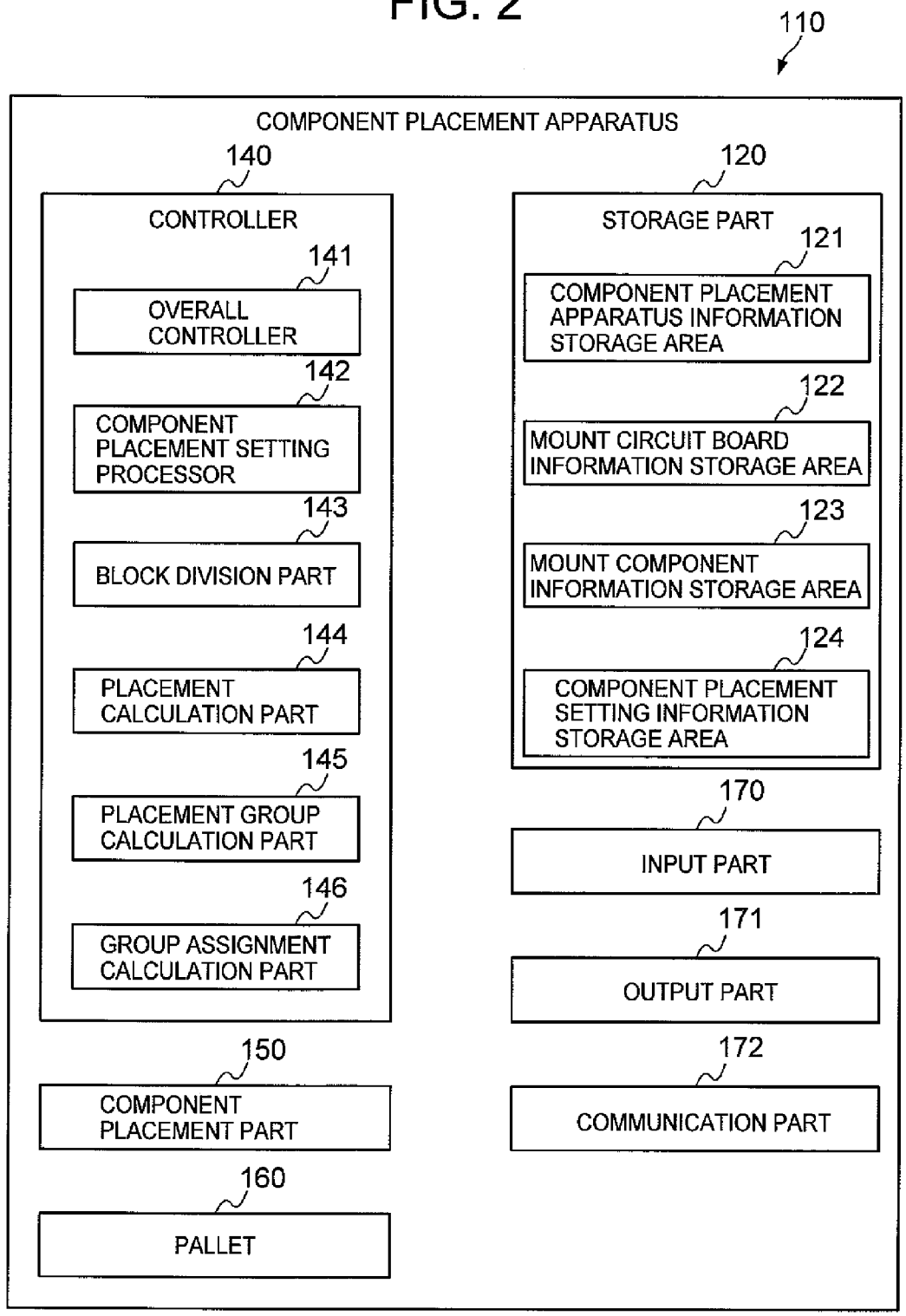
FIG. 2 schematically illustrates the component placement apparatus 110.

FIG. 2 schematically illustrates the component placement apparatus 110. As illustrated, the component placement apparatus 110 is provided with a storage part 120, a controller 140, a component placement part 150, a pallet 160, an input part 170, an output part 171, and a communication part 172.

The storage part 120 is provided with a component placement apparatus information storage area 121, a mount circuit board information storage area 122, a mount component information storage area 123, and a component placement setting information storage area 124.

The component placement apparatus information storage area 121 stores component placement apparatus information for specifying a configuration of the component placement apparatus 110. By way of example, in the present embodiment, a component placement apparatus information table 121a as shown in FIG. 3 (schematic illustration of the component placement apparatus information table 121a) is stored in the component placement apparatus information storage area 121.

As is shown, the component placement information table 121a includes an item field 121b and a value field 121c.

The item field 121b stores information for specifying items that constitute the component placement apparatus 110. Particularly, the items in the present embodiment include "pallet width" for specifying a width that allows mounting of component supply units for supplying components or the number of component supply units that can be mounted, and "head minimum approach distance" for specifying a minimum value of distance indicating how far the placement heads are allowed to approach one another.

The value field 121c stores information for specifying a value which is associated with an item specified in the item field 121b.

Referring to FIG. 2 again, the mount circuit board information storage area 122 stores mount circuit board information for specifying a component to be placed on the circuit board by the component placement apparatus 110, and a position and an angle for placing the component. By way of example, in the present embodiment, a mount circuit board information table 122a as shown in FIG. 4 (schematic illustration of the mount circuit board information table 122a) is stored in the mount circuit board information storage area 122.

As illustrated, the mount circuit board information table 122a includes a placement coordinate and angle field 122b and a component type field 122f.

The placement coordinate and angle field 122b stores information for specifying the position and angle for placing the component on the circuit board, with respect to each component.

By way of example, in the present embodiment, the placement coordinate and angle field 122b incorporates x-field 122c, y-field 122d, and θ-field 122e. The x-field 122c stores information for specifying a value of the x-coordinate on a predetermined x-y coordinate in the circuit board on which a component specified by the component type field 122f is placed, and the y-field 122d stores information for specifying a value of the y-coordinate on a predetermined x-y coordinate in the circuit board on which a component specified by the component type field 122f is placed, the component type field 122f being described later.

In addition, the θ-field 122e stores information for specifying an angle that used for placing the component that is specified in the component type field 122f which will be described later. By way of example, the angle is specified in such a manner that the x-axis direction in the predetermined x-y coordinate is assumed as 0 degree, and anticlockwise rotation is assumed as a positive angle, but this is not an exclusive example.

The component type field 122f stores information for specifying a type of the component to be placed on the circuit board by the component placement apparatus 110. In the present embodiment here, a name of the component is stored as information for specifying the component type.

Referring to FIG. 2 again, the mount component information storage area 123 stores mount component information for specifying a configuration of the component that is placed on the circuit board by the component placement apparatus 110. By way of example, in the present embodiment, a mount component information table 123a as shown in FIG. 5 (schematic illustration of the mount component information table 123a) is stored in the mount component information storage area 123.

As illustrated, the mount component information table 123a includes a component type name field 123b, a component size field 123c, a weight field 123g, and a component supply unit width field 123h.

The component type name field 123b stores information for specifying a type of the component. In the present embodiment here, a component name is stored as the information for specifying the type of the component.

The component size field 123c stores information for specifying a size of the component that is specified in the component type field 123b.

By way of example, in the present embodiment, the component size field 123c includes x-field 123d, y-field 123e, and h-field 123f, and a width, a depth, and a height of the component specified in the component type name field 123b are stored respectively in those fields.

The weight field 123g stores information for specifying the weight of the component specified in the component type name field 123b.

The component supply unit width field 123h stores information for specifying the width of the component supply unit on which the component specified in the component type name field 123b is loaded.

Referring to FIG. 2 again, the component placement setting information storage area 124 stores component placement setting information, including information for specifying a position for mounting the component supply unit, and information for specifying a placement head to pick up a component from the component supply unit, and pickup-and-placement sequencing.

Figure 6:
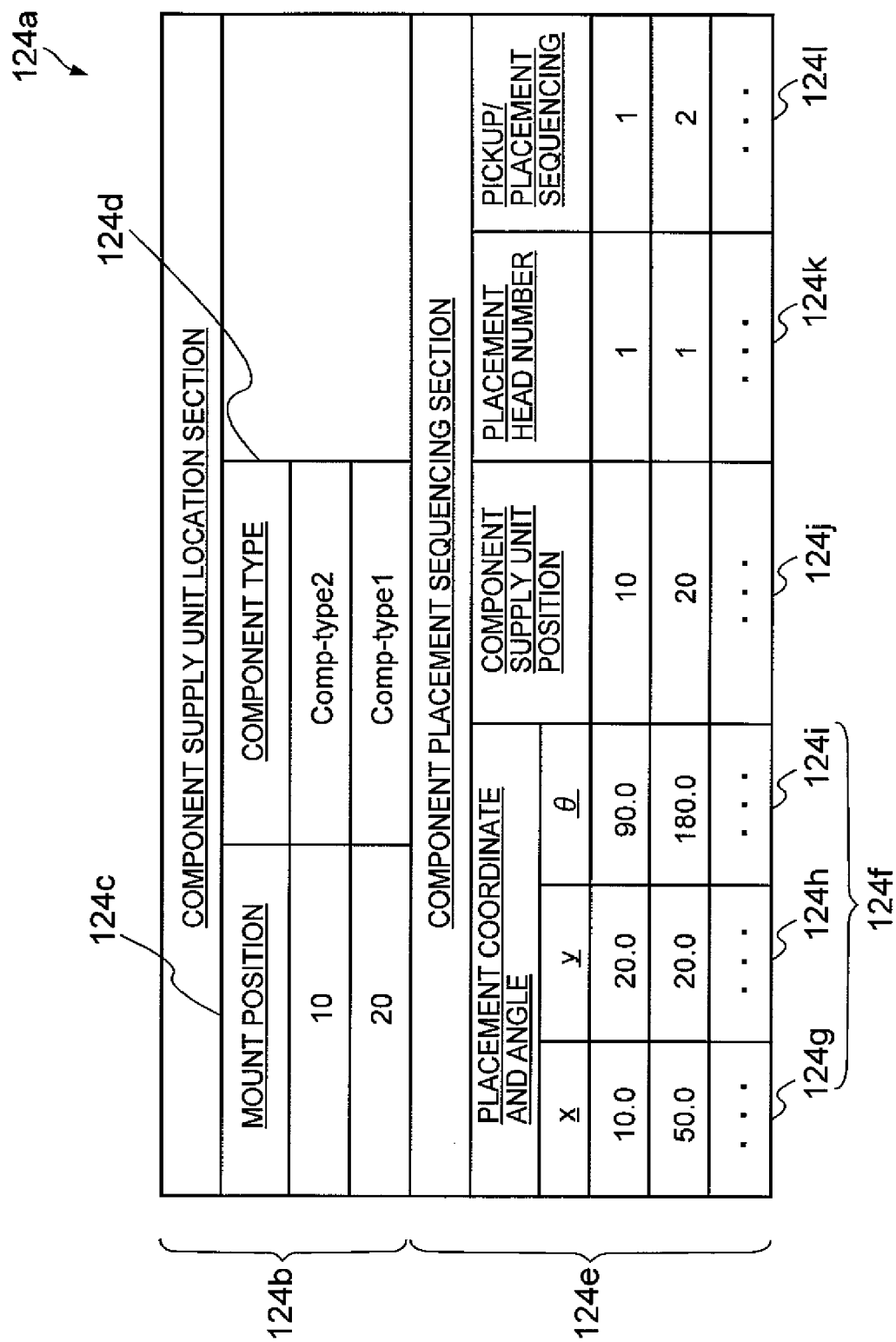

By way of example, in the present embodiment, a component placement setting information table 124a as shown in FIG. 6 (schematic illustration of the component placement setting information table 124a) is stored in the component placement setting information storage area 124.

As illustrated, the component placement setting information table 124a incorporates a component supply unit location section 124b and a component placement sequencing section 124e.

The component supply unit location section 124b includes information for specifying a position where the component supply unit is mounted. By way of example, the component supply unit location section 124b includes a mount position field 124c and a component type field 124d.

The mount position field 124c stores information for specifying a position where the component supply unit is mounted, the component supply unit loading a component specified in the component type field 124d described below. By way of example, in the present embodiment, predetermined identification information (e.g., position numbers or the like, serially numbered from one end of the pallet) is assigned at a position of the pallet where the component supply unit is mounted, and the identification information is stored as to each of the components.

The component type field 124d stores information for specifying a type of the component that is to be placed on the circuit board. In the present embodiment here, a component name is stored as information for specifying the component type.

The component placement sequencing section 124e stores information that specifies a placement head for picking up a component from the component supply unit, as well as pickup-and-placement sequencing.

By way of example, in the present embodiment, the component placement sequencing section 124e includes, a placement coordinate and angle field 124f, a component supply unit position field 124j, a placement head number field 124k, and a pickup/placement sequencing field 124l.

The placement coordinate and angle field 124f stores information for specifying a position and angle on the circuit board, on which the component loaded on the component supply unit is placed, the component supply unit being located at the position specified by the component supply unit position field 124j described below.

By way of example, in the present embodiment, the placement coordinate and angle field 124f includes x-field 124g, y-field 124h, and θ-field 124i, and these fields respectively store information for specifying a value of x-coordinate, a value of y-coordinate, and an angle for placing the component on the circuit board on which the component is to be placed.

The component supply unit position field 124j stores a position on the pallet, on which the component supply unit is mounted, the component supply unit loading the component to be placed on the position of the circuit board at the angle, which are specified in the placement coordinate and angle field 124f. In the present embodiment here, the component supply unit position field 124j stores a value being associated with the value in the mount position field 124c in the component supply unit location section 124b.

The placement head number field 124k stores information for identifying a placement head that picks up a component that is loaded on the component supply unit being mounted on the position that is specified in the component supply unit position field 124j. By way of example, in the present embodiment, an identification number is assigned to each of the placement heads incorporated in the component placement apparatus 110, and the identification number being assigned is stored in the placement head number field 124k.

The pickup/placement sequencing field 124l stores information for specifying sequencing according to which the placement head picks up the component on the component supply unit which is mounted on the position specified by the component supply unit position field 124j, and places the component on the circuit board.

Referring to FIG. 2 again, the controller 140 incorporates an overall controller 141, a component placement setting processor 142, a block division part 143, a location calculation part 144, a placement group calculation part 145, and a group assignment calculation part 146.

The overall controller 141 controls overall processing in the storage part 120, the component placement part 150, the pallet 160, the input part 170, the output part 171, and the communication part 172.

The component placement setting processor 142 controls the overall processing in the controller 140. Particularly in the present embodiment, the component placement setting processor 142 performs the processing such as accepting an input of information for specifying a mount circuit board via the input part 170, reading from the database server 180, mount circuit board information of the mounted circuit board being specified and mount component information, and outputting the component placement setting information to the output part 171.

The block division part 143 performs the processing to divide the pallet 160 into virtually predetermined blocks.

The location calculation part 144 performs a processing to locate a component supply unit into each of the blocks that are virtually divided by the block division part 143.

The placement group calculation part 145 performs processing for specifying a placement group which identifies a group of components to be placed with respect to each placement head, while the placement head moves back and forth once.

The group assignment calculation part 146 performs processing for assigning the placement group calculated by the placement group calculation part 145 to each of the placement heads, and specifies a location of the component placement unit, and the pickup-and-placement sequencing of the components, so as to generate component placement setting information. In the present embodiment here, the group assignment calculation part 146 specifies a location of the component placement unit and the component pickup-and-placement sequencing, so as to avoid a collision between the placement heads (so as to minimize the amount of interference between the placement heads) when the components are picked up and placed.

The component placement part 150 incorporates placement heads, an X-Y robot for moving the placement heads, and a circuit board loading table for loading a circuit board.

Figure 7:
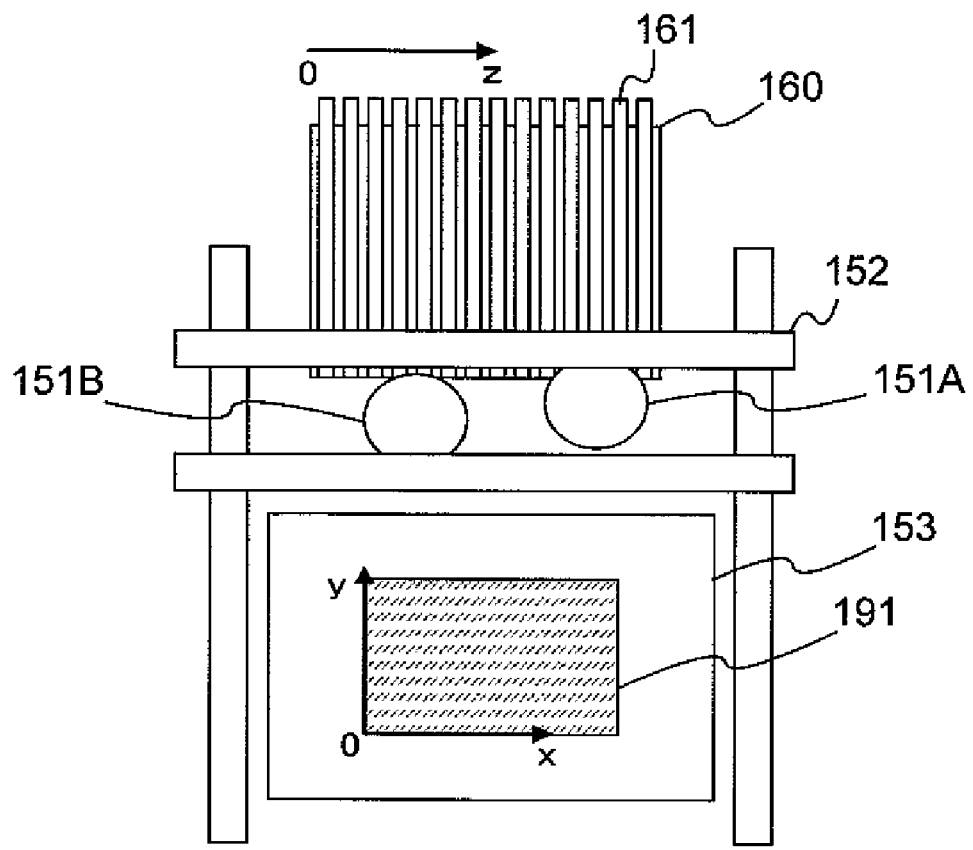
FIG. 7 schematically illustrates the component placement part 150 and the pallet 160.

In the present embodiment, as shown in FIG. 7 (schematic illustration of the component placement part 150 and the pallet 160), multiple placement heads 151A and 151B pick up components from the pallet 160 arranged in one direction with respect to the circuit board 191, and place the components being picked up onto the circuit board 191 loaded on the circuit board loading table 153.

Figure 8:
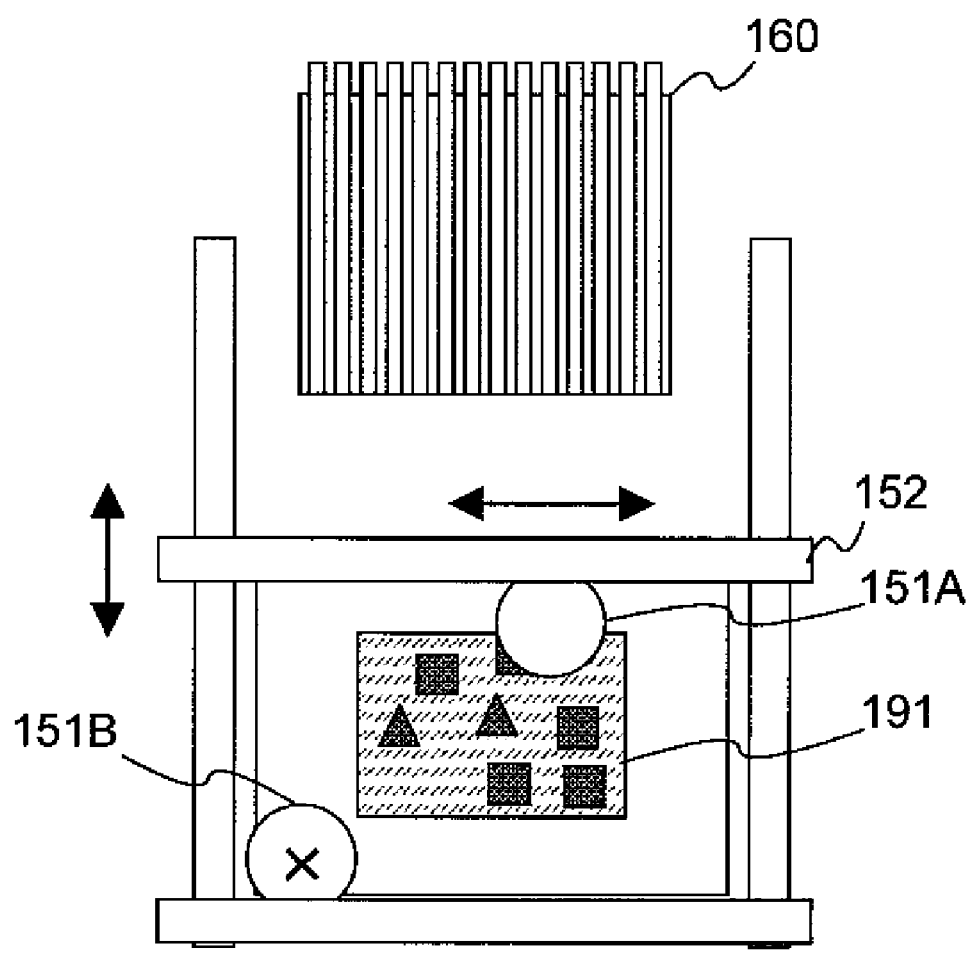
FIG. 8 is a schematic illustration to explain the case where the placement head 151B is located at an escape position.

As thus described, in the case where the multiple placement heads 151A and 151B access the circuit board 191 and the pallet simultaneously, there may occur an interference between the placement heads 151A and 151B. Therefore, if there is an interference between the placement heads 151A and 151B, as shown in FIG. 8 (schematic illustration for explaining the situation where the placement head 151B is located at an escape position), it is necessary that any one of the placement heads 151A and 151B (in the example here, indicating the placement head 151B that is located further from the pallet 160 than the other placement head) is withdrawn to the escape position for avoiding the interference between the placement heads 151A and 151B (in the example here, the escape position represents a predetermined position deviating from an area where the placement head 151A moves to pick up and convey the component and to place the component onto the circuit board 191).

It is to be noted that in the present invention, the component placement setting information is generated in such a manner that the placement heads 151A and 151B are allowed to pick up, convey, and place the component efficiently, with little possibility of withdrawal to the escape position as possible.

As shown in FIG. 7, the component supply units 161 are mounted on the pallet 160, and the pallet 160 controls the component supply units 161 being mounted, so as to locate the components loaded on the component supply unit 161 on positions where the placement heads 151A and 151B are allowed to perform the pickup.

The input part 170 accepts an input of information.

The output part 171 outputs information.

The communication part 172 sends and receives information via the network 190.

Figure 9:
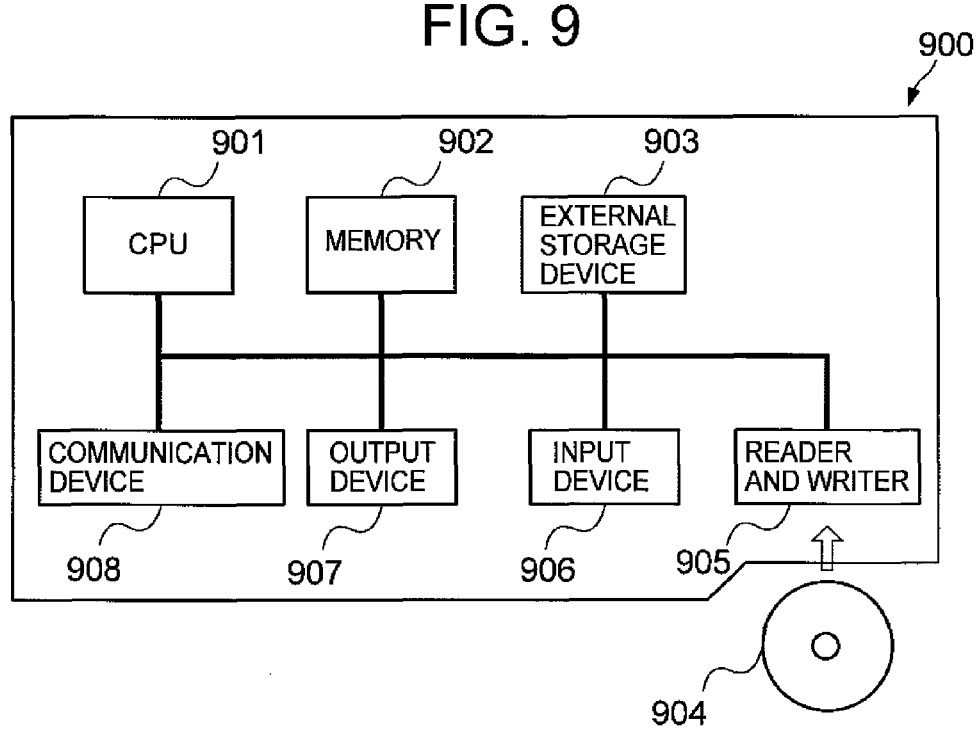
FIG. 9 schematically illustrates the computer 900.

As shown in FIG. 9 (schematic illustration of a computer 900), the component placement apparatus 110 as described above may be implemented by the computer 900 incorporating a CPU (Central Processing Unit) 901, a memory 902, an external storage device 903 such as HDD (Hard Disk Drive), a reader/writer 905 for reading information from and writing information to a storage medium 904 having a portability such as CD-ROM (Compact Disk Read Only Memory) and DVD-ROM (Digital Versatile Disk Read Only Memory), an input device 906 such as a keyboard and a mouse, an output device 907 such as a display, and a communication device 908 such as NIC (Network Interface Card) for establishing connection with a communication network, the computer 900 further provided with the component mounting device including the X-Y robot, the placement heads (not illustrated), the circuit board mounting table, and the pallet device (not illustrated).

By way of example, the CPU 901 utilizes the memory 902 or the external storage device 903 to implement the storage part 120, the controller 140 is implemented by loading in the memory 902 a predetermined program stored in the external storage device 903 and the CPU 901 executes the program, the CPU 901 utilizes the component mounting device not illustrated, thereby implementing the component placement part 150, the CPU 901 utilizes the pallet device not illustrated to implement the pallet 160, the CPU 901 utilizes the input device 906 to implement the input part 170, the CPU 901 utilizes the output device 907 to implement the output part 171, and the CPU 901 utilizes the communication device 908 to implement the communication part 172.

The predetermined program may be downloaded from the storage medium 904 via the read and write device 905, or from the network via the communication device 908, into the external storage device 903, and then loaded into the memory 902 to be executed by the CPU 901. Alternatively, the predetermined program may be downloaded from the storage medium 904 via the read and write device 905, or from the network via the communication device 908, and directly loaded into the memory 902 to be executed by the CPU 901.

Figure 10:
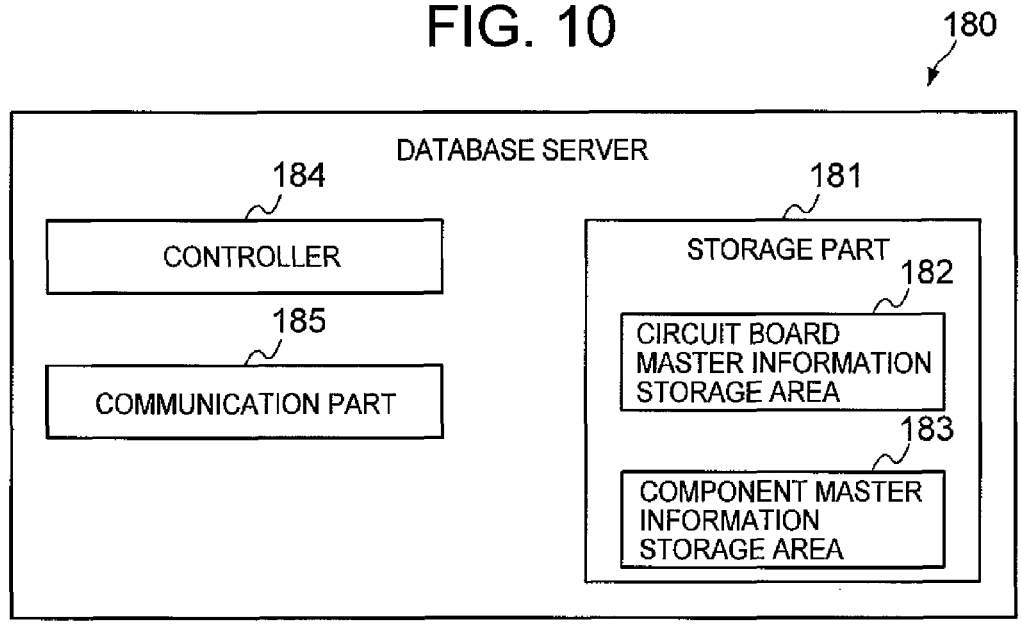
FIG. 10 schematically illustrates the database server

FIG. 10 is a schematic illustration of the database server 180.

As illustrated, the database server 180 incorporates a storage part 181, a controller 184, and a communication part 185.

The storage part 181 incorporates a circuit board master information storage area 182 and a component master information storage area 183.

The circuit board master information storage area 182 stores circuit board master information for specifying a component to be placed on the circuit board by the component placement apparatus 110, and a placement position and angle of the component. By way of example, in the present embodiment, table information having the same configuration as the mount circuit board information table 122a as shown in FIG. 4 is stored as the circuit board master information, with respect to each circuit board.

The component master information storage area 183 stores component master information for specifying a configuration of the component to be placed on the circuit board by the component placement apparatus 110. By way of example, in the present embodiment, table information having the same configuration as the mount component information table 123a as shown in FIG. 5 is stored as the component master information.

The controller 184 manages the information stored in the storage part 181. Particularly in the present embodiment, in response to a request from the component placement apparatus 110, the controller 184 controls a processing for sending the circuit board master information stored in the circuit board master information storage area, and the component master information stored in the component master information storage area 183, to the component placement apparatus 110.

The communication part 185 sends and receives information via the network 190.

The database server 180 as described above may also be implemented by the computer 900 as shown in FIG. 9, for instance.

By way of example, the CPU 901 utilizes the memory 902 or the external storage device 903 to implement the storage part 181, the controller 184 can be implemented by loading a predetermined program stored in the external storage device 903 into the memory 902 and executing the program by the CPU 901, and the CPU 901 utilizes the communication device 908 to implement the communication part 185.

The predetermined program may be downloaded from the storage medium 904 via the read and write device 905, or from the network via the communication device 908, into the external storage device 903, and then loaded into the memory 902 to be executed by the CPU 901. Alternatively, the predetermined program may be downloaded from the storage medium 904 via the read and write device 905, or from the network via the communication device 908, and directly loaded into the memory 902 to be executed by the CPU 901.

Figure 11:
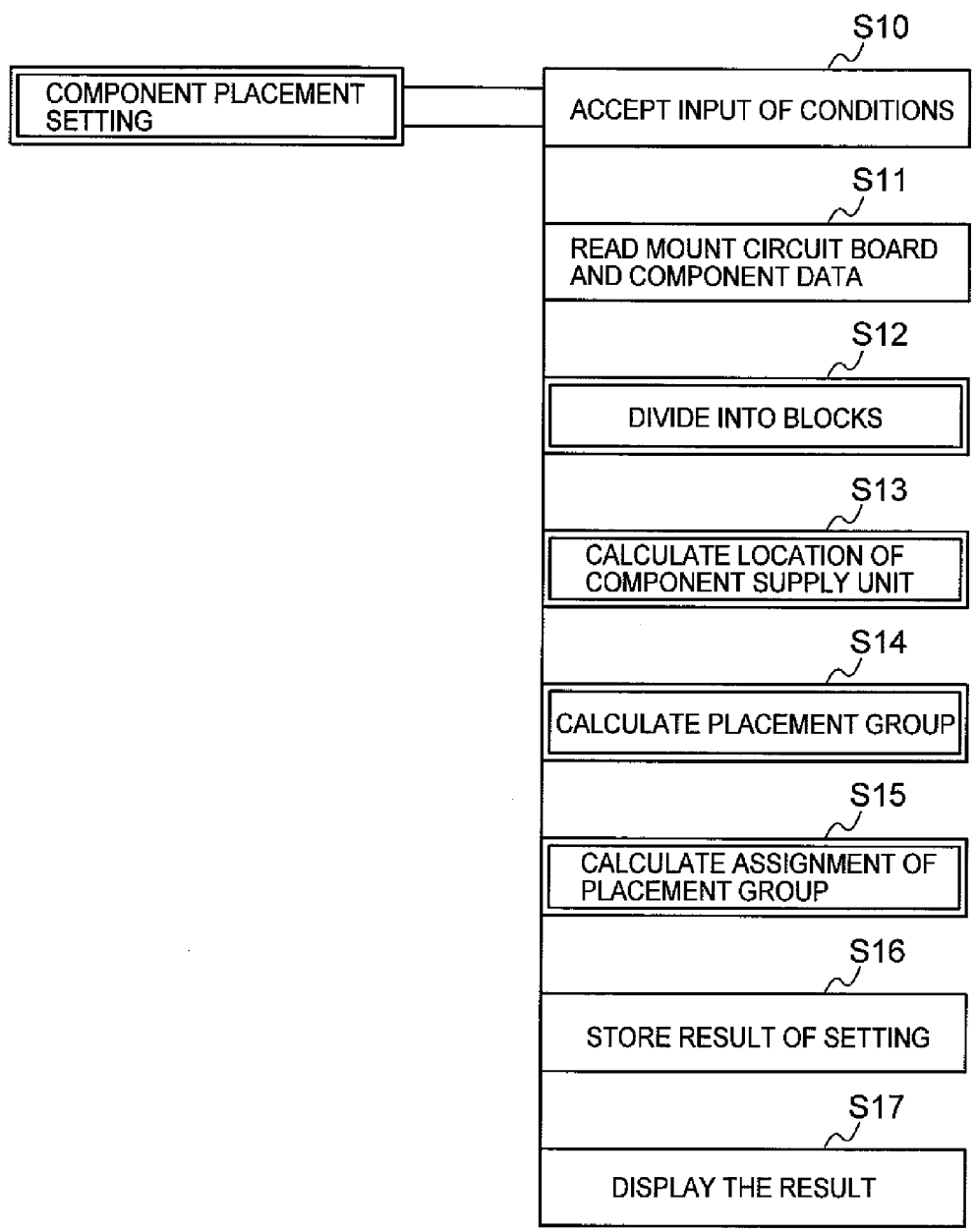
FIG. 11 is a PAD showing the processing to generate the component placement setting information.

FIG. 11 is a PAD (Problem Analysis Diagram) showing a processing for generating the component placement setting information by the component placement apparatus 110.

Details of the PAD are described in "Program Techniques, Structured Programming using PAD, JOHO KOGAKU KISO KOZA (Computer Science Basic Course) 4", Yoshihiko Nimura, OMU Co., 1984.

The component placement setting processor 142 accepts an input from a user of the component placement apparatus 110 as to the information (e.g., circuit board ID) for specifying a type of the circuit board on which the component placement apparatus 110 places a component (S10).

Next, the component placement setting processor 142 reads from the database server 180, table information of the circuit board being associated with the circuit board ID being inputted, and component information specified in the table information (S11).

Specifically, the component placement setting processor 142 sends a read request including the information that specifies the circuit board ID being inputted in step S10, to the database server 180 via the communication part 172.

In the database server 180, which has received the read request as described above, the controller 184 acquires from the circuit board master information storage area 182, the table information being associated with the circuit board ID included in the read request. The controller 184 extracts information (component type name, in this example) for specifying a type of the component that is stored in the component type field of the table information being acquired, and acquires from the component master information storage area 183, a record being associated with the component type name being extracted.

Then, the controller 184 sends the table information and the record, having been acquired as described above, to the component placement apparatus 110 via the communication part 185.

In the component placement apparatus 110 that has received the table information and the record, the component placement setting processor 142 stores the received table information in the mount circuit board information storage area 122 as a mount circuit board information table 122a, and further generates a table in which the received record is stored, so as to store the table in the mount component information storage area 123, as the mount component information table 123a.

Next, the block division part 143 divides the pallet 160 by block width "w", which is predetermined virtually, and generates blocks (S12). This processing will be explained in detail later with reference to FIG. 12.

Next, the location calculation part 144 arranges component supply units respectively in the blocks, which are virtually divided by the block division part 143 (S13).

The location calculation part 144 decides a block to assign the component supply unit and calculates a position of the component supply unit within the block being decided, in such a manner that the number of components to be placed from the component supply unit located in each of the blocks is as even as possible, and mean coordinates for placing the components from the component supply units located in each of the blocks are as close to one another as possible. It is to be noted that this processing will be explained in detail with reference to FIG. 13 to FIG. 15.

Next, the placement group calculation part 145 calculates a placement group for specifying a group of components to be placed, with respect to each placement head, while the placement head goes and returns once between the component pickup position and the component placement position (S14).

In the calculation of the placement group, the placement group is generated in such a manner that all the component supply units storing the components constituting the placement group belong to the same block, and the placement coordinates of the components constituting the placement group are as close as possible to one another. It is to be noted that this processing will be explained in detail with reference to FIG. 16.

Next, the group assignment calculation part 146 assigns the placement group calculated by the placement group calculation part 145 to each of the placement heads, and specifies locations of the component placement units and component pickup-and-placement sequencing (S15). Here, according to the assignment of the placement group to each of the placement heads, it is determined with which placement head and at which position in going and returning sequencing of the placement head, the constituent components belonging to each placement group are placed. It is to be noted that this processing will be explained in detail with reference to FIG. 17 and FIG. 18.

Next, the group assignment calculation part 146 stores the locations of the component supply units and the component placement sequencing, which are calculated by steps S10 to S15, respectively in the component supply unit location section 124b and the component placement sequencing section 124e, thereby generating the component placement setting information table 124a, and the table is stored in the component placement setting information storage area 124 (S16).

Then, the component placement setting processor 142 processes the component placement setting information table 124a being generated into a predetermined display format, and displays it on the output part 171 (S17).

Figure 12:
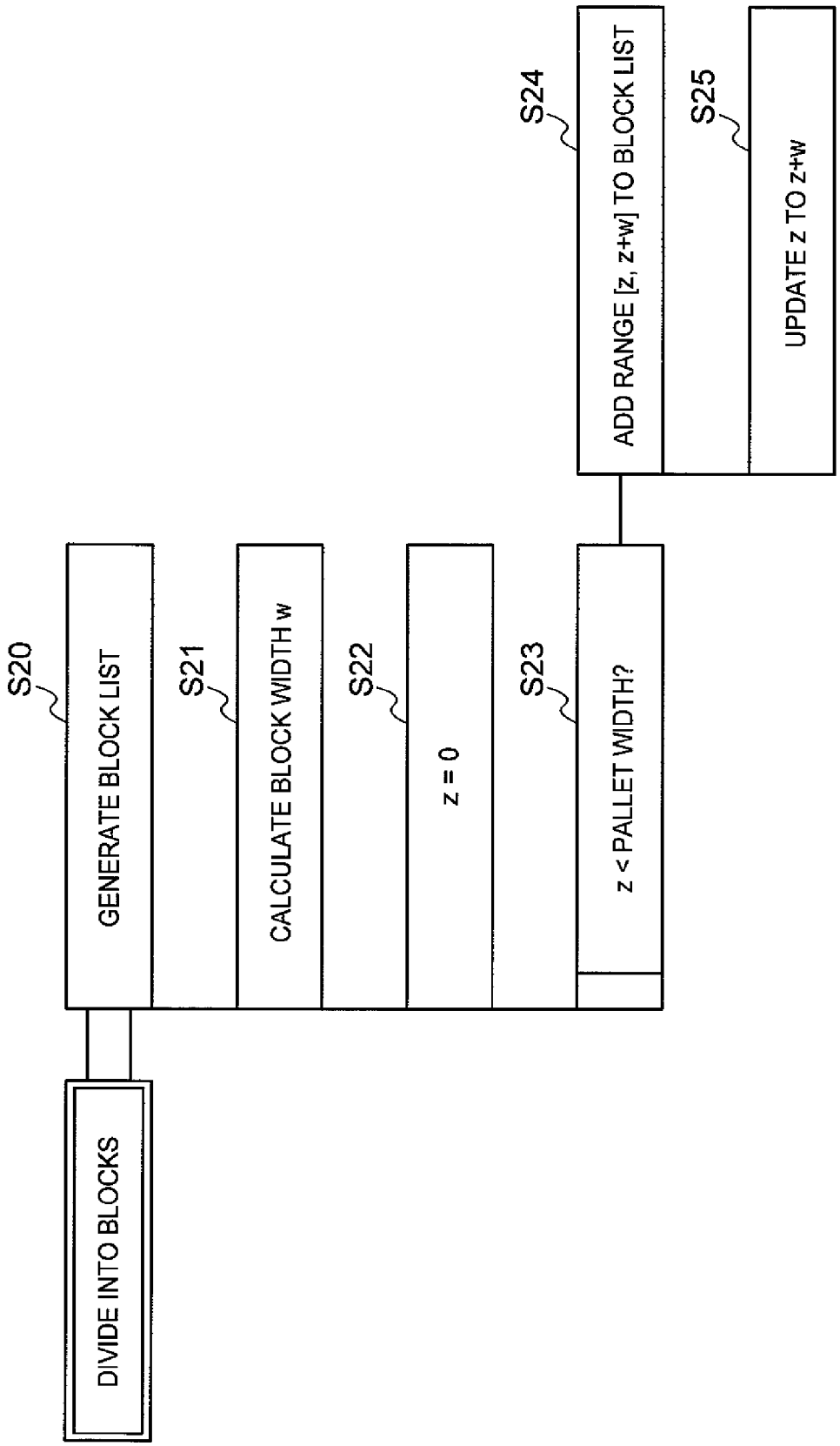
FIG. 12 is a PAD showing the processing to divide the pallet into blocks.

FIG. 12 is a PAD showing a processing to divide the pallet into blocks, which is performed in step S12 shown in FIG. 11.

The block division part 143 generates a block list to store information for specifying each block (S20) Initial state of the block list is assumed as an empty set.

Next, the block division part 143 calculates block width w (S21). Here, the block width w is assumed as between or equal to a minimum approach distance of the placement head and the pallet width. In the present embodiment, the block width w is assumed as the minimum approach distance of the placement head, but this is not an exclusive example.

Next, as shown in FIG. 7, the block division part 143 generates a temporary variable z, which represents a coordinate value on z-coordinate assuming the direction from one end to the other of the pallet 160 as a positive direction, and initializes the variable to zero (S22).

Next, the block division part 143 repeatedly executes the processing steps S24 and S25, as far as a value of the variable z falls into a range of the pallet width (S23)

Then, the block division part 143 assumes a range [z, z+w] on the pallet 160 as one block, and adds the block to the block list (S24).

Next, the block division part 143 updates the temporary variable z to z+w (S25).

Figure 13:
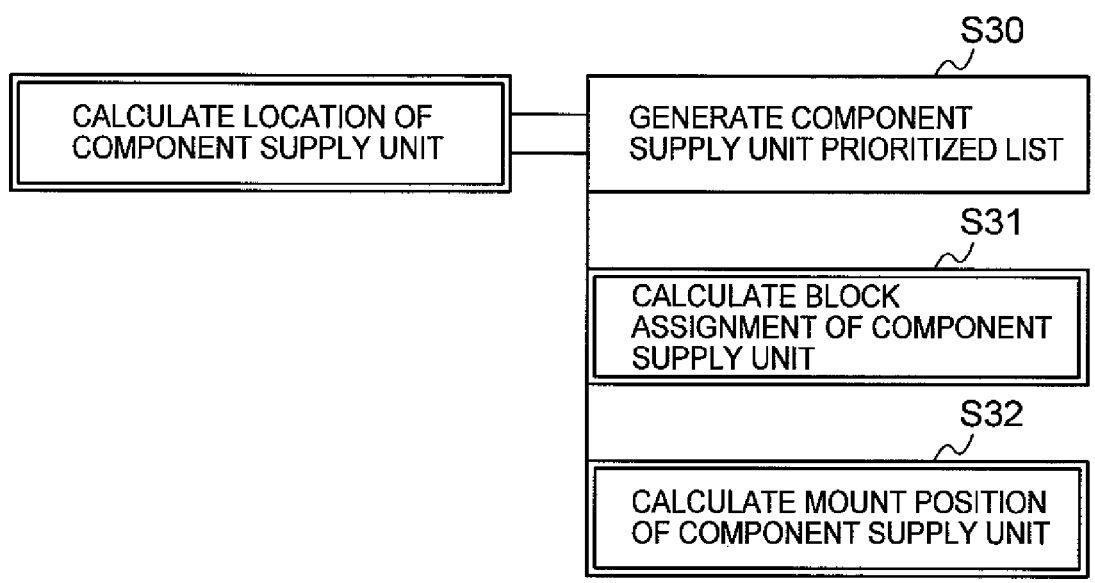
FIG. 13 is a PAD showing the processing to calculate a location of the component supply unit.

FIG. 13 is a PAD showing a processing to calculate a location of the component supply unit as shown in FIG. 11.

The location calculation part 144 generates a component supply unit prioritized list, in which priority is given to the component supply unit (S30) Here, the component supply unit prioritized list is a list including the component supply units, on which components to be placed on a circuit board by the component placement apparatus 110 are loaded, the components being sorted in descending order, using the number of the components to be placed from each of the component supply units as a key.

Next, the location calculation part 144 performs assignment of the block to mount the component supply unit thereon, in such a manner that the number of components to be placed from the component supply units assigned to each of the blocks is as even as possible, and the mean coordinates for placing the components from the component supply units located in each of the blocks are as close to one another as possible (S31). It is to be noted that the processing above will be explained in detail with reference to FIG. 14.

Next, the location calculation part 144 calculates a position for mounting each component supply unit, by using a cyclic path that approximates a shortest cyclic path of the mean coordinate for placing the component from each component supply unit which is assigned to each block (S32). It is to be noted that this processing will be explained in detail with reference to FIG. 15.

Figure 14:
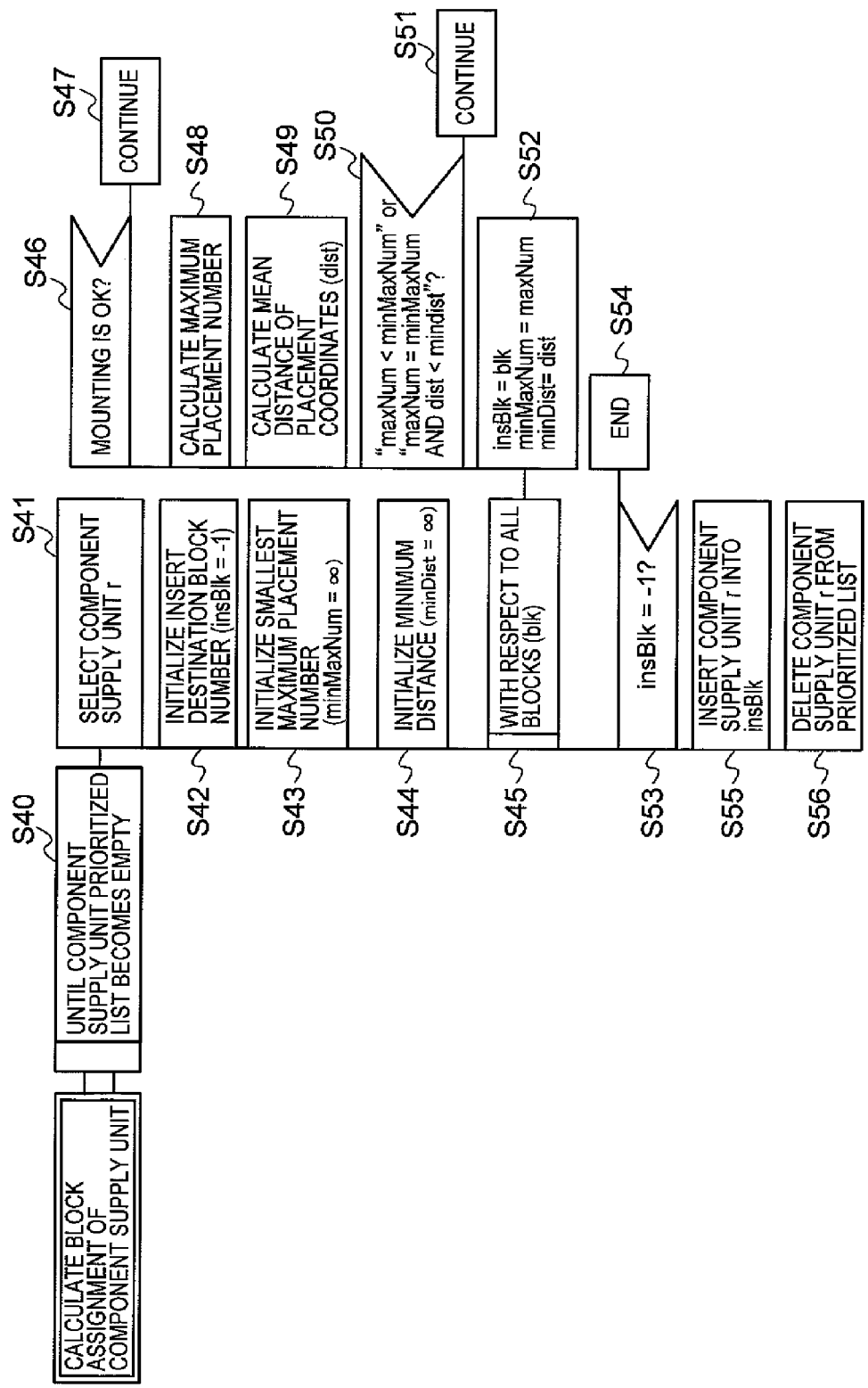
FIG. 14 is a PAD showing the processing to calculate a block assignment to the component supply unit.

FIG. 14 is a PAD showing a processing for calculating a block assignment of the component supply unit in step S31 as shown in FIG. 13.

The location calculation unit 144 repeatedly executes the processing from step S41 to step S56, which will be described below, until the component supply unit prioritized list generated in step S30 of FIG. 13 becomes empty (S40).

In step S41, the location calculation part 144 selects a component supply unit r that is recorded on the top of the component supply unit prioritized list.

In step S42, the location calculation part 144 initializes "insBlk" to "−1", which is a temporary variable (a block number as an insertion destination) for mounting the component supply unit r selected in step S41.

In step S43, the location calculation part 144 initializes the temporary variable "minMaxNum" representing the smallest value of "a maximum value of the number of components placed from the component supply units mounted in each block", to +∞ (the largest number that can be handled by the location calculation part 144).

In step S44, the location calculation part 144 initializes a temporary variable "minDist" representing a minimum value of the distance between a mean coordinate for placing the components from the component supply unit already mounted on each block and a mean coordinate for placing the components from the component supply unit r, to +∞ (the largest number that can be handled by the location calculation part 144).

In step S45, the location calculation part 144 repeatedly executes the steps S46 to S52 described below, as to all the blocks "blk" which are stored in the block list generated in step S12 in FIG. 11. In other words, in step S45, an arbitrary block blk, which is not subjected to the processing from steps S46 to S52 described below, is selected from the blocks stored in the block list generated in step S12 of FIG. 11, and steps S46 to S52 described below are executed for the block.

In step S46, the location calculation part 144 determines whether or not the component supply unit r can be mounted on the block blk that is selected in step S45, and if the result is "No", the processing proceeds with S47. It is to be noted, in the present embodiment, a sum wBlk of the width of the component supply unit which is already determined to be mounted on the block blk, and the width of the component supply unit r is figured out. If wBlk≦w is satisfied, it is determined that the mounting is possible.

In step S47, the location calculation part 144 returns to step S45 to select a different block and repeats the processing.

In step S48, the location calculation part 144 assumes that the component supply unit r is mounted on the block blk, and calculates the number of components to be placed from all the component supply units mounted on the block blk, and this number of components is assumed as a maximum number of placement maxNum.

In step S49, the location calculation part 144 calculates a distance "dist" between the mean coordinate for placing the components from all the component supply units mounted on the block "blk", and the mean coordinate for placing the component from the component supply unit r. Here, the mean coordinate for placement may be obtained by calculating an arithmetic average of the coordinates of respective components placed from the component supply units, with regard to each of x-coordinate and y-coordinate.

In step S50, the location calculation part 144 determines whether or not either one of the following two conditional expressions (conditional expression 1 and conditional expression 2) is satisfied, and if the result is "No", the processing proceeds with step S51, returns to step S45, and a different block is selected to repeat the processing.

maxNum<minMaxNum             Conditional expression 1 maxNum=minMaxNum and dist<minDist    Conditional expression 2

In step S52, the location calculation part 144 updates the values of insBlk, minMaxNum, and minDist, to "blk", "maxNum", and "dist", respectively.

In step S53, the location calculation part 144 determines whether or not "insBlk" is −1, and if the result is "Yes", in step S54, an error message such as "there is a component supply unit that cannot be mounted" to the output part 171, notifies a user of the result, and terminates the processing.

In step S55, the location calculation part 144 inserts the component supply unit r into the block insBlk, in other words, a mounting position of the component supply unit r is assigned to the block insBlk (block assignment).

In step S56, the location calculation part 144 deletes the component supply unit r from the component supply unit prioritized list.

Figure 15:
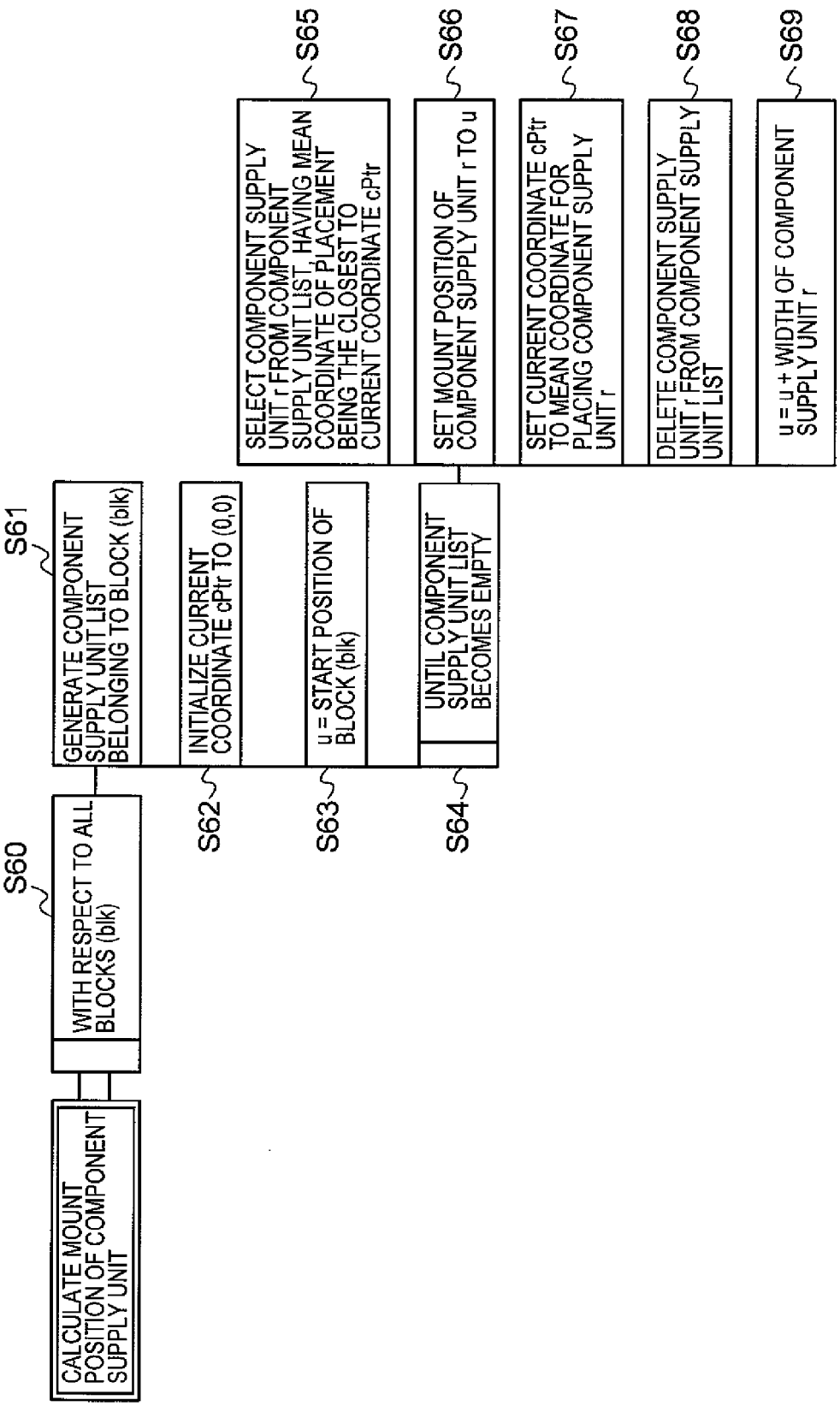
FIG. 15 is a PAD showing the processing to a mount position of the component supply unit.

FIG. 15 is a PAD showing a processing to calculate the mounting position of the component supply unit in step S32 of FIG. 13.

The location calculation part 144 executes the processing from steps S61 to S69 as to all the blocks blk. In other words, arbitrary blocks blk are selected one by one from the blocks stored in the block list that is generated in step S12 of FIG. 11, and those blocks are subjected to the processing executed in steps from S61 to S69 described below.

In step S61, the location calculation part 144 generates a list of the component supply units belonging to the block blk.

In step S62, the location calculation part 144 initializes a current coordinate cPtr, which is used in the processing described below, to the origin point (0, 0). Here, as shown in FIG. 7, the position of the origin point (0, 0) may be assumed as an optional edge part (the edge part on the observer's lower-left in FIG. 7) of the circuit board 191 that is formed in a shape of rectangle, but this is not an exclusive configuration.

In step S63, the location calculation part 144 initializes temporary variable u indicating a mounting position of the component supply unit to a start position of the block blk. Here, the start position of the block may be specified as any position on z-axis as shown in FIG. 7.

In step S64, the location calculation part 144 executes the processing from steps S65 to S69 as described below, until the component supply unit list generated in step S61 becomes empty.

In step S65, the location calculation part 144 checks the component supply unit list sequentially, and selects a component supply unit r having a mean coordinate for placing the component from the component supply unit, which is the closest to the current coordinate cPtr.

In step S66, the location calculation part 144 sets "u", as a mounting position of the component supply unit r that is selected in step S65.

In step S67, the location calculation part 144 updates the current coordinate cPtr to the mean coordinate for placing the component from the component supply unit r.

In step S68, the location calculation part 144 deletes the component supply unit r from the component supply unit list.

In step S69, the location calculation part 144 updates the coordinate u to (u+the width of the component supply unit r).

Figure 16:
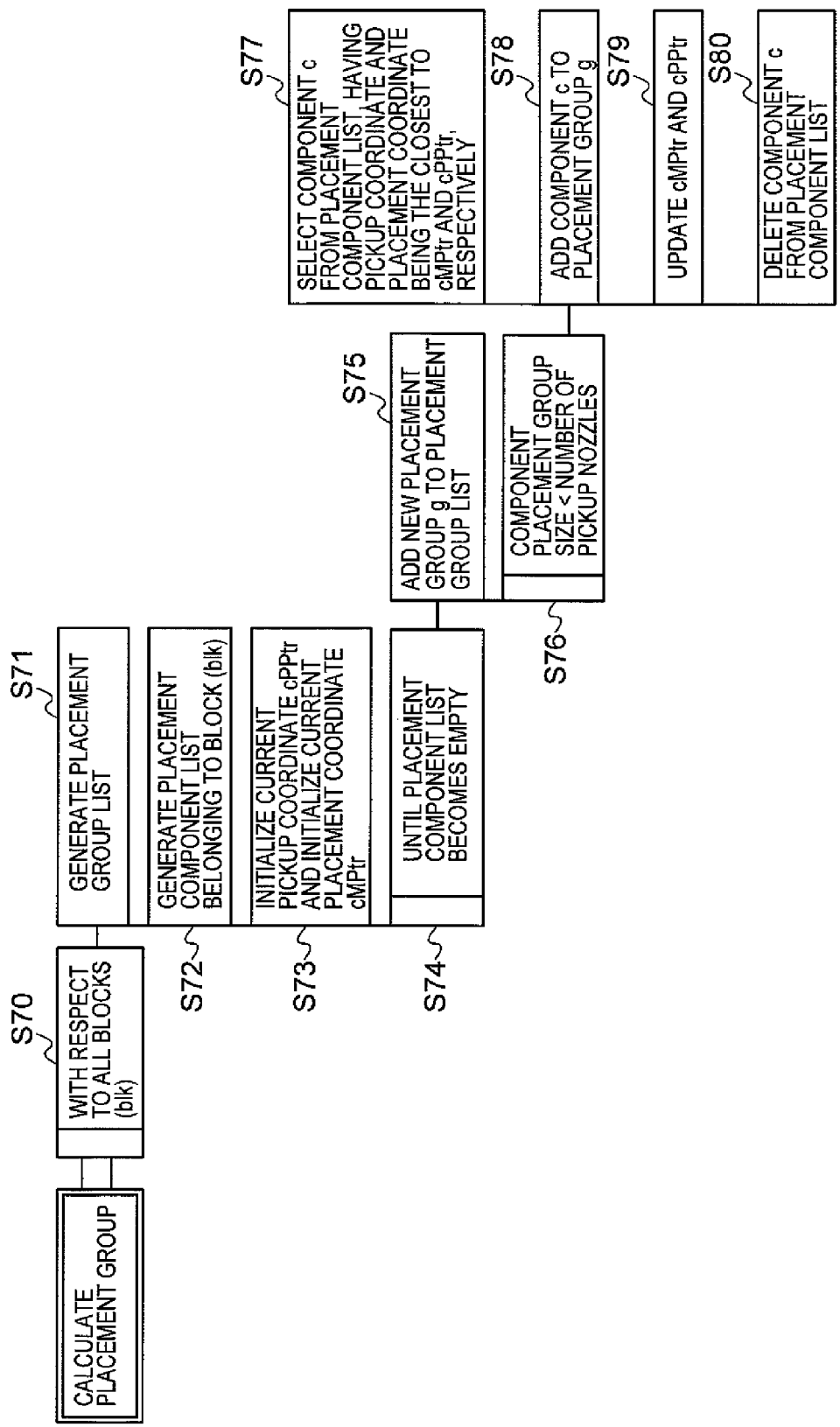
FIG. 16 is a PAD showing the processing to calculate a placement group.

FIG. 16 is a PAD showing a processing for calculating the placement group in step S14 of FIG. 11.

At first, the placement group calculation part 145 executes the processing of steps S71 to S80 described below, as to all the blocks blk belonging to the block list that is generated in step S12 of FIG. 11 (S70). In other words, the placement group calculation part 145 selects a block blk one by one from all the blocks belonging to the block list generated in step S12 of FIG. 11, and these blocks are subjected to the processing from step S71 to S80 described below.

In step S71, the placement group calculation part 145 generates a placement group list. Here, the initial state of the placement group list is an empty set.

In step S72, the placement group calculation part 145 generates a placement component list, which is a list of components to be placed from the component supply units belonging to the block blk.

In step S73, the placement group calculation part 145 initializes the current pickup coordinate cPPtr used in the processing described below to the origin point (the origin point 0 of z-axis as shown in FIG. 7), and the current placement coordinate cMPtr to the origin point (the origin point (0, 0) on the x-y coordinate as shown in FIG. 7).

In step S74, the placement group calculation part 145 executes the processing from steps S75 to S80 described below, until the placement component list becomes empty.

In step S75, the placement group calculation part 145 adds a new placement group g (in this example here, it is an empty set) to the placement group list.

In step S76, the placement group calculation part 145 executes the processing from step S77 to step S80 described below, as far as the size (the number of constituent components) of the placement group g is smaller than the number of pickup nozzles provided on one placement head.

In step S77, the placement group calculation part 145 sequentially checks the placement component list, and selects a component "c" which has a minimum sum of "the distance between a mount position of the component supply unit storing the component and the current pickup coordinate cPPtr", and "the distance between the coordinate for placing the component and the current placement coordinate cMPtr".

In step S78, the placement group calculation part 145 adds the component "c" to the placement group "g".

In step S79, the placement group calculation part 145 updates the current pickup coordinate cPPtr to the mount position of the component supply unit which stores the component "c", and updates the current placement coordinate cMPtr to the placement coordinate of the component "c".

In step S80, the placement group calculation part 145 deletes the component "c" from the placement component list.

Figure 17:
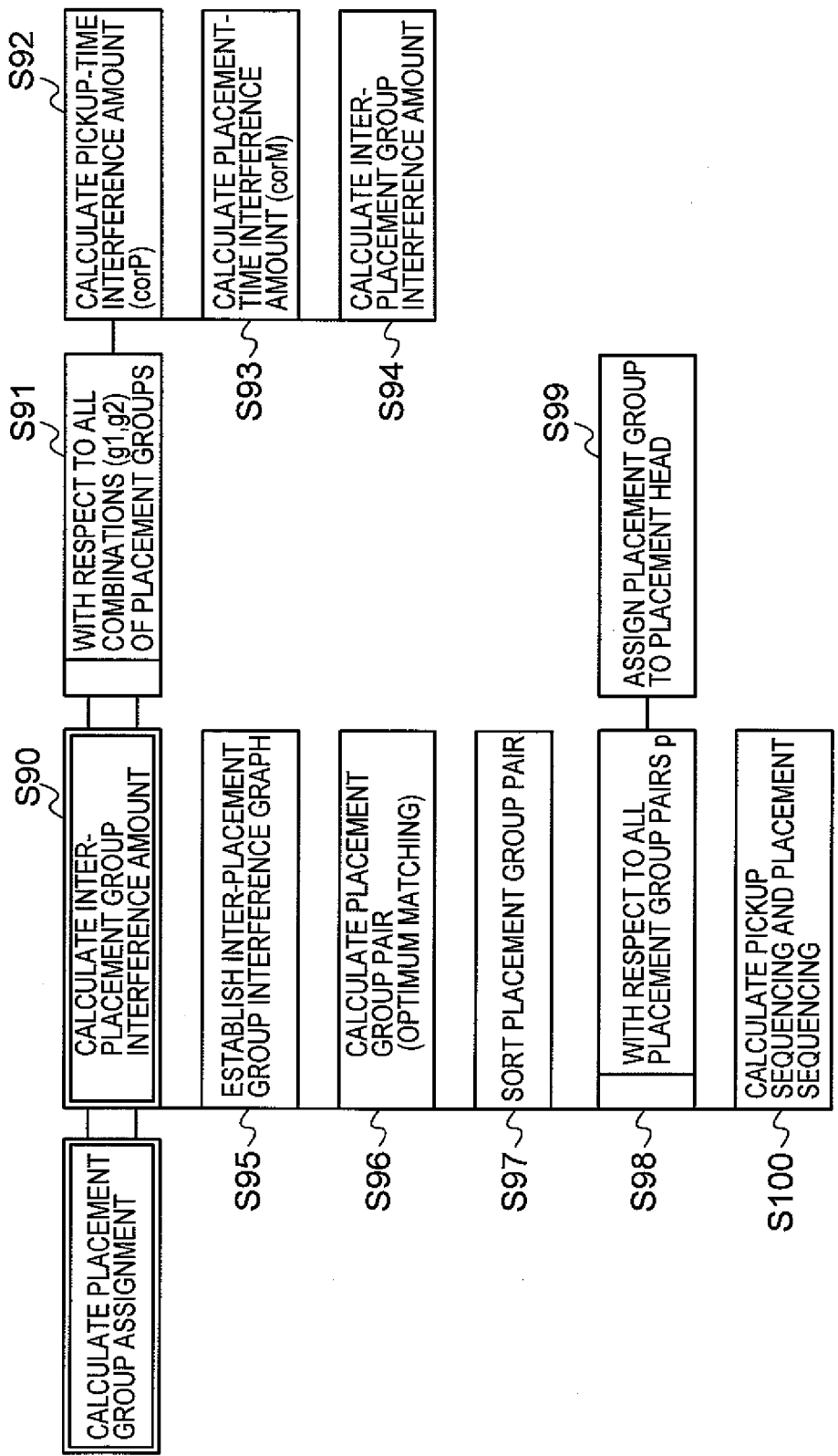
FIG. 17 is a PAD showing the processing to calculate an assignment of the placement group.

FIG. 17 is a PAD showing a processing for calculating the assignment of the placement group in step S15 of FIG. 11.

At first, in step S90, the group assignment calculation part 146 performs the processing from step S91 to S94 described below, and calculates inter-placement group interference amount (indicating to what extent the component supply unit mounting positions are overlapping and the component placement coordinates are overlapping).

In step S91, the group assignment calculation part 146 executes the processing from steps S92 to S94 as described below, as to all combinations of pairs (g1, g2) of the placement groups belonging to the placement group list which is generated in the processing for calculating the placement group in step S14 of FIG. 11. In other words, the group assignment calculation part 146 selects an arbitrary combination of pairs (g1, g2) one by one from all the combinations of pairs of the placement groups belonging to the placement group list which is generated in the processing for calculating the placement group in step S14 of FIG. 11, and then the combination of pairs is subjected to the processing from step S92 to step S94 as described below.

In step S92, the group assignment calculation part 146 calculates a pickup-time interference amount corp (g1, g2) between the combination of pairs (g1, g2), according to the formula (1).
[Formula 1]

$$corP(g1,g2) = \text{Max}\{\text{Min}(z\text{Max}1 - z\text{Min}2, z\text{Max}2 - z\text{Min}1), 0\} \quad (1)$$

Here, in the formula 1, "zMin1" and "zMax1" represent respectively a minimum value and a maximum value of the mounting position of the component supply unit which stores constituent components of the placement group g1, and "zMin2" and "zMax2" respectively represent a minimum value and a maximum value of the mounting position of the component supply unit for storing the constituent components of the placement group g2. It is to be noted that Max(A, B) indicates to select the maximum value out of A and B, and Min(C, D) indicates to select the minimum value out of C and D.

In step S93, the group assignment calculation part 146 calculates a placement-time interference amount corM(g1, g2), between the combination of pairs (g1, g2) by the following formula 2.
[Formula 2]

$$corM(g1,g2) = \text{Max}\{\text{Min}(x\text{Max}1 - x\text{Min}2, x\text{Max}2 - x\text{Min}1), 0\} + \text{Max}\{\text{Min}(y\text{Max}1 - y\text{Min}2, y\text{Max}2 - y\text{Min}1), 0\} \quad (2)$$

In the formula 2, "xMin1" and "xMax1" represent respectively a minimum value and a maximum value on the x-coordinate of the placement positions of the constituent components in the placement group g1, "yMin1" and "yMax1" represent respectively a minimum value and a maximum value on the y-coordinate of the placement positions of the constituent components in the placement group g1, "xMin2" and "xMax2" represent respectively a minimum value and a maximum value on the x-coordinate of the placement positions of the constituent components in the placement group g2, and "yMin2" and "yMax2" represent respectively a minimum value and a maximum value on the y-coordinate of the placement positions of the constituent components in the placement group g2.

In step S94, the group assignment calculation part 146 calculates an inter-placement group interference amount cor (g1, g2), according to the following formula 3.
[Formula 3]

$$cor(g1,g2) = corP(g1,g2) + corM(g1,g2) \quad (3)$$

In step S95, the group assignment calculation part 146 establishes a placement group interference graph. Here, the placement group interference graph has a graph structure in which the placement group generated in step S14 of FIG. 11 is represented as a "node", and the placement group interference amount calculated in the aforementioned step S94 is represented as a weight of "edge" which connects nodes.

Figure 18:
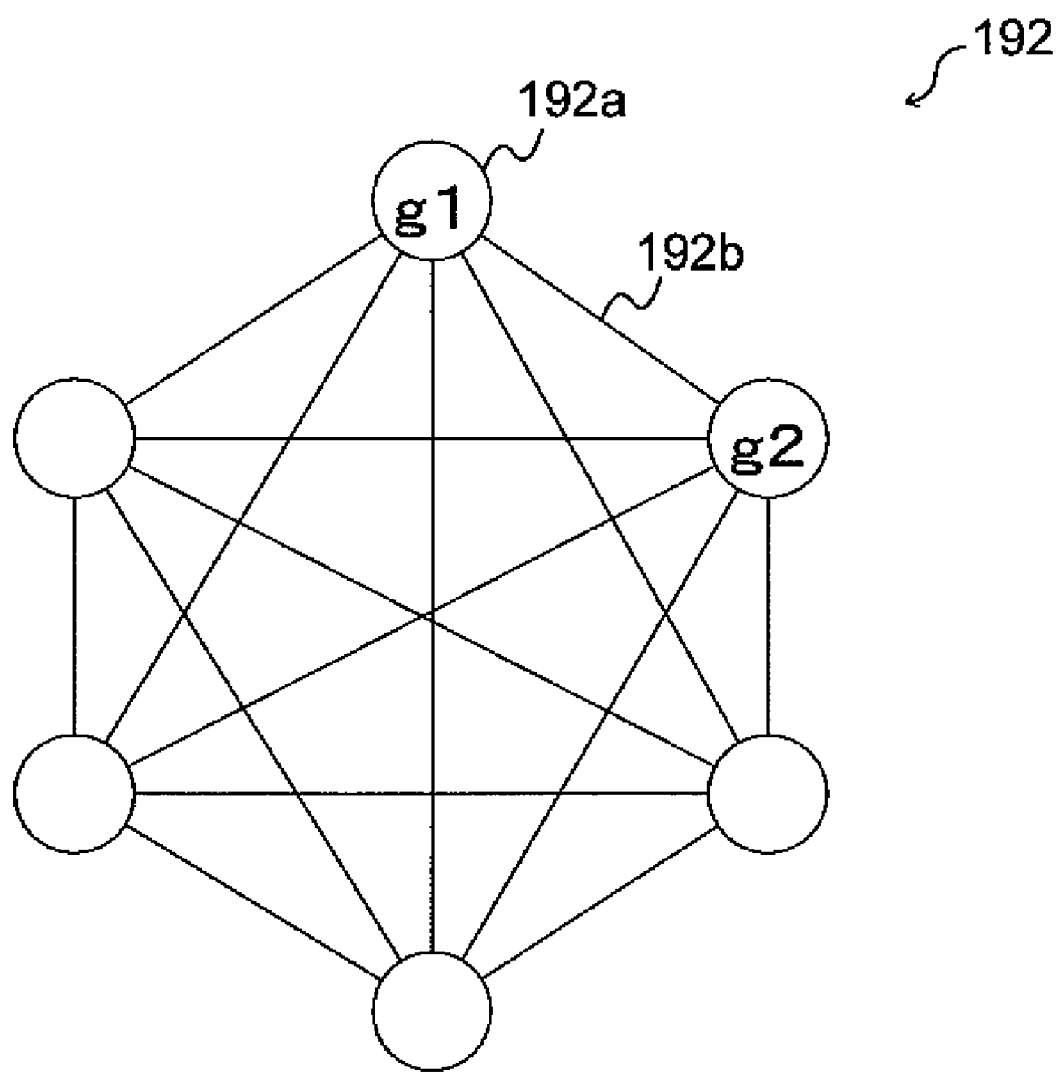
FIG. 18 schematically illustrates a placement group interference graph 192.

FIG. 18 schematically illustrates the placement group interference graph 192. In this figure, a node is indicated with 192a, and an edge is indicated with 192b.

In step S96, an optimum matching of the placement group interference graph is calculated, the placement group interference graph being established in the aforementioned step S95. Hereinafter, a combination of the placement groups, which are coupled by the edges constituting the optimum matching, is referred to as a "placement group pair".

The optimum matching is calculated by obtaining a group (matching) satisfying the following conditions (a) to (c) from the edges constituting the placement group interference graph as shown in FIG. 18:

(a) the number of edge selected as a matching, out of the edges connecting each node is equal to or less than one;

(b) as many edges as possible are constituent elements; for example, an optimum matching is determined in descending order, starting from the number obtained by (the number of nodes)/2, when the number of the nodes is an even number, and from the number obtained by (the number of nodes−1)/2, when the number of the nodes is an odd number; and (c) a sum of the weighted values of the edges belonging to the matching is small as possible.

When the placement group coupled by the edges belonging to the optimum matching is assumed as a placement group to be placed in each going-and-returning, it indicates that there is less interference at the time of pickup and placement, in other words, there is less escaping operation and therefore, the implementation time is made shorter.

It is to be noted that Hungarian method (Hungary method) is known as a method for calculating the optimum matching. For example, it is possible to calculate the optimum matching by adding sequentially an edge to the matching, starting from the edge having a small weight value.

As described above, each placement group can be placed from the component supply units belonging to one block, whereby it is possible to generate a large number of pairs of placement groups which do not interfere with one another at the time of picking up.

In step S97, the group assignment calculation part 146 sorts the placement group pairs which are calculated in step S96. As a reference of the sorting, for instance, it is possible to utilize a descending order of the weight values of the edges which define the placement group pairs. The placement group which does not belong to a pair is assumed as having the edge weight value of zero.

In step S98, the group assignment calculation part 146 executes repeatedly the processing of step S99, as to all the placement group pairs p, which are calculated in step S96.

In step S99, the group assignment calculation part 146 assigns the placement groups belonging to the placement group pair p, respectively to the placement heads. In this example here, out of the placement groups belonging to the placement group pair p, a placement group having a smaller minimum value of placement coordinate (y-axis) of the components constituting the placement group, and the placement group that has not made a pair, are assigned to the placement head located at a position distant from the pallet (in FIG. 7, the placement head 151B). However, this configuration is not exclusive example, and any assignment method is applicable, as far as the placement groups belonging to the placement group pair p are respectively assigned to different placement heads.

In step S100, the group assignment calculation part 146 calculates the sequencing of pickup/placement of each component. By way of example, in the present embodiment, as for the placement groups assigned to the placement heads respectively, they are set according to the order which is sorted in step S97 described above. Within each of the placement groups, the component pickup/placement sequencing is set according to the order in which the component is added to the placement group in step S14 of FIG. 11. However, the embodiment described above is not exclusive example.

Figure 19:
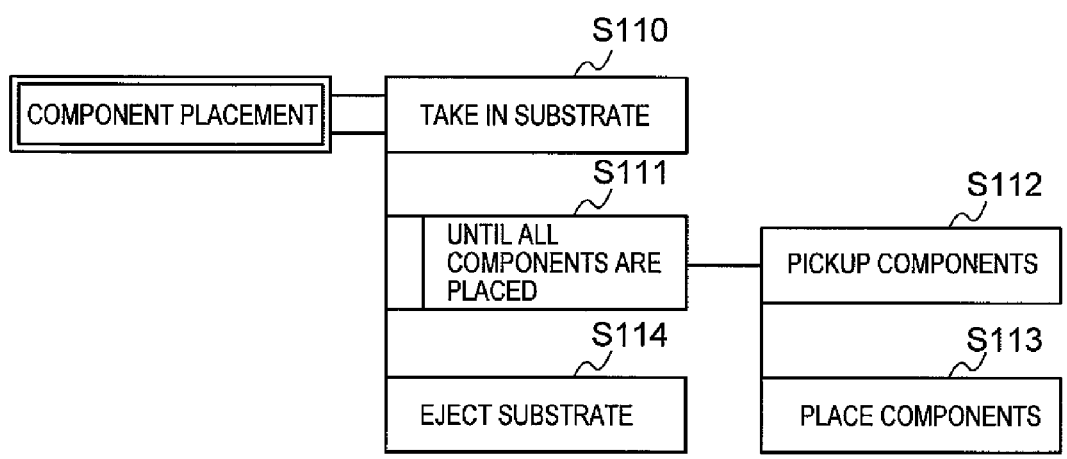
FIG. 19 is a PAD showing a procedure of component placement.

FIG. 19 is a PAD showing a procedure for placing a component in the component placement apparatus 110.

In step S110, the overall controller 141 of the component placement apparatus 110 controls the circuit board table of the component placement part 150, thereby locating the circuit board on the position where the component placement is performed.

In step S111, the overall controller 141 repeats the processing from step S112 to S113 until all the components are placed.

In step S112, the overall controller 141 uses the placement heads of the component placement part 150 to pick up the component for the placement by the next going-and-returning, according to the pickup sequencing stored in the pickup/placement sequencing field 124*l* of the component placement setting information table 124*a*, which is stored in the component placement setting information storage area 124.

In step S113, the overall controller 141 places components by using the placement heads of the component placement part 150, according to the placement sequencing stored in the pickup/placement sequencing field 124*l* of the component placement setting information table 124*a*.

In step S114, the overall controller 141 controls the circuit board table of the component placement part 150, so as to eject the circuit board 0107 on which the component placement is completed.

As discussed above, according to the present invention, in the component placement apparatus in which multiple placement heads simultaneously access the circuit board and the pallet which is located in one direction with respect to the circuit board, settings of the component placement can be configured considering the escaping operation of the placement heads. Therefore, a user is allowed to produce a desired circuit board within a short period of time.

The pallet is virtually divided into multiple blocks, and the component placement setting is performed in such a manner that only the components stored in the component supply units mounted in the same block are picked up and placed, in every going-and-returning of each placement head. Therefore, it is possible to achieve a component placement setting, involving less escaping operation.

Figure 20:
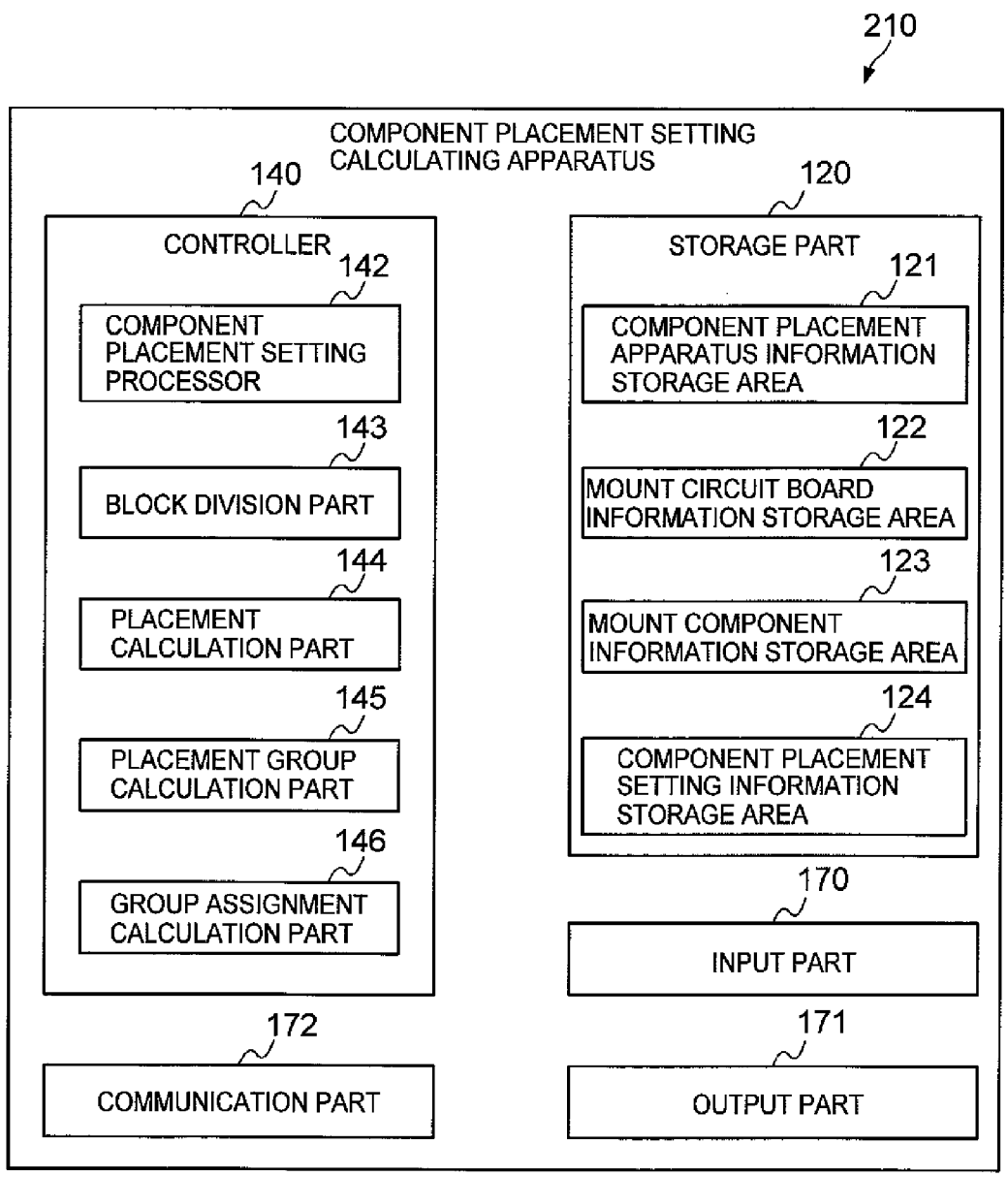
FIG. 20 schematically illustrates the component placement setting calculation apparatus 210.

In the embodiment as described above, the component placement setting information is calculated in the component placement apparatus 110 incorporating the component placement part 150 and the pallet 160. However, this embodiment is not an exclusive example. For example, the component placement setting information (a component placement setting table) may be generated in the component placement setting calculation apparatus 210 as shown in FIG. 20 (schematic diagram of the component placement setting calculation apparatus 210), and the information may be transmitted to a component placement apparatus.

As illustrated, the component placement setting calculation apparatus 210 is provided with a storage part 120, a controller 140, an input part 170, an output part 171, and a communication part 172, and these elements function in the same manner as the storage part 120, the controller 140, the input part 170, the output part 171, and the communication part 172 of the component placement apparatus 110.

It is to be noted that the component placement setting calculation apparatus 210 described so far can be implemented by the computer 900 as shown in FIG. 9.

By way of example, the CPU 901 utilizes the memory 902 or the external storage device 903 to implement the storage part 120, the controller 140 can be implemented by loading a predetermined program stored in the external storage device 903 into the memory 902 and executed by the CPU 901, the CPU 901 utilizes a component mounting device not illustrated, thereby implementing the component placement part 150, the CPU 901 utilizes a pallet device to implement the pallet 160, the CPU 901 utilizes the input device 906 to implement the input part 170, the CPU 901 utilizes the output device 907 to implement the output part 171, and the CPU 901 utilizes the communication device 908 to implement the communication part 172.

This predetermined program may be downloaded from the storage medium 904 via the read and write device 905, or from the network via the communication device 908, into the external storage device 903, and then loaded into the memory 902 to be executed by the CPU 901. Alternatively, this predetermined program may be downloaded from the storage medium 904 via the read and write device 905, or from the network via the communication device 908, and directly loaded into the memory 902 to be executed by the CPU 901.

What is claimed is:

1. A component placement apparatus which allows multiple placement heads to operate to pick up components from a pallet and to operate to place the components on a circuit board arranged in one direction with respect to the pallet during one operation, wherein, the component placement apparatus comprises a controller to perform a processing, during the one operation that the multiple placement heads, each of which moves in a different area, pick up the components from the pallet and place the components on the circuit board, for specifying a pair of component groups to be picked up from the pallet by the multiple placement heads so that an area where the multiple placement heads move in an overlapping manner is minimized, and the processing for allowing each of the placement heads to operate to pick up the components included respectively in the component groups forming the pair, and to operate to place the components being picked up on the circuit board.

2. The component placement apparatus according to claim 1, wherein, the controller generates the component group made up of components including a component picked up from a position being close to a predetermined coordinate, and a component to be placed at a position being close to a predetermined coordinate, and out of combinations of the component groups, the controller specifies a pair of component groups that minimizes an area where the multiple placement heads move in an overlapping manner, during the one operation for picking up the components from the pallet and placing the components on the circuit board.

3. The component placement apparatus according to claim 2, wherein, among a maximum number of combinations of the component groups generable without any overlaps, the controller specifies the pair which minimizes a sum of an interference amount between the placement heads when the multiple placement heads simultaneously pick up components from the pallet, and an interference amount between the placement heads when the multiple placement heads simultaneously place the components on the circuit board.

4. The component placement apparatus according to claim 3, wherein, the controller assumes a range of coordinates of an area overlapping between from a minimum value to a maximum value on the pickup positions of the components included in the component group and from a minimum value to a maximum value on the pickup positions of the components included in another component group forming a combination, as an interference amount between the placement heads when the multiple placement heads simultaneously pick up the components from the pallet, and the controller assumes an additional value of a range of coordinates of an area overlapping between from a minimum value to a maximum value of x-coordinate on the placement positions of the components included in the component group and from a minimum value to a maximum value of x-coordinate on the placement positions of the components included in another component group forming the combination, and a range of coordinates of an area overlapping between from a minimum value to a maximum value of y-coordinate on the placement positions of the components included in the component group and from a minimum value to a maximum value of y-coordinate on the placement positions of the components included in another component group forming the combination, as an interference amount between the placement heads when the multiple placement heads simultaneously place the components on the circuit board.

5. The component placement apparatus according to claim 2, wherein, the controller divides the pallet into blocks having a width between or equal to a minimum width in which the multiple placement heads do not interfere with one another and the width of the pallet, and generates the component group from the blocks divided.

6. A component placement setting calculation apparatus which generates component placement setting information for specifying sequencing for picking up and placing components by each of multiple placement heads, when the multiple placement heads operate to pick up components from a pallet and operate to place the components on a circuit board arranged in one direction with respect to the pallet during one operation, wherein, the component placement setting calculation apparatus comprises a controller to perform a processing, during the one operation that the multiple placement heads, each of which moves in a different area, pick up the components from the pallet and place the components on the circuit board, for specifying a pair of component groups to be picked up from the pallet by the multiple placement heads so that an area where the multiple placement heads move in an overlapping manner is minimized, and the processing for generating the component placement setting information that allows each of the placement heads to operate to pick up the components included respectively in the component groups forming the pair, and to operate to place the components being picked up, on the circuit board.

7. The component placement setting calculation apparatus according to claim 6, wherein, the controller generates the component group made up of components including a component picked up from a position being close to a predetermined coordinate, and a component to be placed at a position being close to a predetermined coordinate, and out of combinations of the component groups, the controller specifies a pair of component groups that minimizes an area where the multiple placement heads move in an overlapping manner, during the one operation for picking up the components from the pallet and placing the components on the circuit board.

8. The component placement setting calculation apparatus according to claim 7, wherein, among a maximum number of combinations of the component groups generable without any overlaps, the controller specifies the pair which minimizes a sum of an interference amount between the placement heads when the multiple placement heads simultaneously pick up components from the pallet, and an interference amount between the placement heads when the multiple placement heads simultaneously place the components on the circuit board.

9. The component placement setting calculation apparatus according to claim 8, wherein, the controller assumes a range of coordinates of an area overlapping between from a minimum value to a maximum value on the pickup positions of the components included in the component group and from a minimum value to a maximum value on the pickup positions of the components included in another component group forming a combination, as an interference amount between the placement heads when the multiple placement heads simultaneously pick up the components from the pallet, and the controller assumes an additional value of a range of coordinates of an area overlapping between from a minimum value to a maximum value of x-coordinate on the placement positions of the components included in the component group and from a minimum value to a maximum value of x-coordinate on the placement positions of the components included in another component group forming the combination, and a range of coordinates of an area overlapping between from a minimum value to a maximum value of y-coordinate on the placement positions of the components included in the component group and from a minimum value to a maximum value of y-coordinate on the placement positions of the components included in another component group forming the combination, as an interference amount between the placement heads when the multiple placement heads simultaneously place the components on the circuit board.

10. The component placement setting calculation apparatus according to claim 7, wherein,
the controller divides the pallet into blocks having a width between or equal to a minimum width in which the multiple placement heads do not interfere with one another and the width of the pallet, and generates the component group from the blocks divided.

11. A non-transitory computer-readable medium embodying a program which allows a computer to function as a component placement setting calculation apparatus which generates component placement setting information for specifying sequencing for picking up and placing components by each of multiple placement heads, when the multiple placement heads operate to pick up components from a pallet and operate to place the components on a circuit board arranged in one direction with respect to the pallet during one operation, wherein,
the program allows the computer to function as a control means to perform a processing, during the one operation that the multiple placement heads each of which moves in a different area, pick up the components from the pallet and place the components on the circuit board, for specifying a pair of component groups to be picked up from the pallet by the multiple placement heads so that an area where the multiple placement heads move in an overlapping manner is minimized, and the processing for generating the component placement setting information that allows each of the placement heads to operate to pick up the components included respectively in the component groups forming the pair, and to operate to place the components being picked up, on the circuit board.

12. The non-transitory computer-readable medium according to claim 11, where the program allowing the control means to perform a processing for generating the component group made up of components including a component picked up from a position being close to a predetermined coordinate, and a component to be placed at a position being close to a predetermined coordinate, and out of combinations of the component groups, specifying a pair of component groups that minimizes an area where the multiple placement heads move in an overlapping manner, during the one operation for picking up the components from the pallet and placing the components on the circuit board.

13. The non-transitory computer-readable medium according to claim 12, where the program allowing the control means to perform a processing for specifying, among a maximum number of combinations of the component groups generable without any overlaps, the pair which minimizes a sum of an interference amount between the placement heads when the multiple placement heads simultaneously pick up components from the pallet, and an interference amount between the placement heads when the multiple placement heads simultaneously place the components on the circuit board.

14. The non-transitory computer-readable medium according to claim 13, where the program allowing the control means to perform a processing for:
assuming, a range of coordinates of an area overlapping between from a minimum value to a maximum value on the pickup positions of the components included in the component group and from a minimum value to a maximum value on the pickup positions of the components included in another component group forming a combination, as an interference amount between the placement heads when the multiple placement heads simultaneously pick up the components from the pallet, and assuming an additional value of a range of coordinates of an area overlapping between from a minimum value to a maximum value of x-coordinate on the placement positions of the components included in the component group and from a minimum value to a maximum value of x-coordinate on the placement positions of the components included in another component group forming the combination, and a range of coordinates of an area overlapping between from a minimum value to a maximum value of y-coordinate on the placement positions of the components included in the component group and from a minimum value to a maximum value of y-coordinate on the placement positions of the components included in another component group forming the combination, as an interference amount between the placement heads when the multiple placement heads simultaneously place the components on the circuit board.

15. The non-transitory computer-readable medium according to claim 11, where the program allowing the control means to perform the processing for dividing the pallet into blocks having a width between or equal to a minimum width in which the multiple placement heads do not interfere with one another and the width of the pallet, and generating the component group from the blocks divided.

16. A computer-implemented component placement setting calculation method for allowing a component placement setting calculation apparatus to generate component placement setting information for specifying sequencing for picking up and placing components by each of multiple placement heads, when the multiple placement heads operate simultaneously to pick up components from a pallet and operate to place the components on a circuit board arranged in one direction with respect to the pallet during one operation, wherein the component placement setting calculation method comprising:
specifying, during the one operation that the multiple placement heads which each move in a different area to pick up the components from the pallet and place the components on the circuit board, a pair of component groups to be picked up from the pallet by the multiple placement heads so that an area where the multiple placement heads move in an overlapping manner is minimized, and generating the component placement setting information that allows each of the placement heads to operate to pick up the components included respectively in the component groups forming the pair, and to operate to place the components being picked up on the circuit board.

17. A component placement apparatus which allows multiple placement heads to simultaneously move independently of one another to pick up components from a supply area and to place the components on a circuit board arranged in one direction with respect to the supply area during one operation, wherein, the component placement apparatus comprises a controller to perform a processing, during the one operation that the multiple placement heads moving independently of one another pick up the components from the supply area and place the components on the circuit board, for specifying a pair of component groups to be picked up from the supply area by the multiple placement heads so that an area where the multiple placement heads move in an overlapping manner is minimized, and the processing for allowing each of the placement heads to operate to pick up the components included respectively in the component groups forming the pair, and to operate to place the components being picked up, on the circuit board.

* * * * *